US009224210B2

United States Patent
Epstein et al.

(10) Patent No.: US 9,224,210 B2
(45) Date of Patent: Dec. 29, 2015

(54) SYSTEMS AND METHODS FOR ACCELERATED DYNAMIC MAGNETIC RESONANCE IMAGING

(71) Applicant: University of Virginia Patent Foundation, Charlottesville, VA (US)

(72) Inventors: Frederick H Epstein, Charlottesville, VA (US); Xiao Chen, Charlottesville, VA (US); Yang Yang, Charlottesville, VA (US); Michael Salerno, Charlottesville, VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 88 days.

(21) Appl. No.: 14/174,748

(22) Filed: Feb. 6, 2014

(65) Prior Publication Data

US 2014/0219531 A1 Aug. 7, 2014

Related U.S. Application Data

(60) Provisional application No. 61/761,496, filed on Feb. 6, 2013.

(51) Int. Cl.
*G06T 7/20* (2006.01)
*G06T 7/00* (2006.01)
(Continued)

(52) U.S. Cl.
CPC ............ *G06T 7/20* (2013.01); *G01R 33/56308* (2013.01); *G01R 33/56509* (2013.01);
(Continued)

(58) Field of Classification Search
CPC .................. G06T 7/20; G06T 7/0012; G06T 2207/30048; G06T 2207/10096; G06K 2209/05; G06K 9/6218
See application file for complete search history.

(56) References Cited

U.S. PATENT DOCUMENTS 4,999,580 A  3/1991  Meyer
5,233,301 A  8/1993  Meyer et al.
(Continued)

FOREIGN PATENT DOCUMENTS

WO  2012145547 A1  10/2012
WO  2013023214 A1  2/2013

OTHER PUBLICATIONS

Lingala, S.G.; Yue Hu; DiBella, E.; Jacob, M., "Accelerated Dynamic MRI Exploiting Sparsity and Low-Rank Structure: k-t SLR," Medical Imaging, IEEE Transactions on , vol. 30, No. 5, pp. 1042, 1054, May 2011 doi: 10.1109/TMI.2010.2100850.*
(Continued)

*Primary Examiner* — Utpal Shah
(74) *Attorney, Agent, or Firm* — Troutman Sanders LLP; Ryan A. Schneider; Christopher W. Glass

(57) ABSTRACT

Some aspects of the present disclosure relate to systems and methods for accelerated dynamic magnetic resonance imaging (MRI). In an example embodiment, a method includes acquiring undersampled MRI data corresponding to a set of images associated with an area of interest of a subject, and separating an image of the set of images into image regions. The method also includes performing motion tracking for each of the image regions, grouping the motion-tracked image regions into clusters, and applying a sparsity transform to the clusters, to form sparsity-exploited, transformed image regions. The method further includes forming a set of merged images from the plurality of sparsity-exploited, transformed image regions, and updating the set of merged images based on data fidelity, to form an updated set of estimated images.

24 Claims, 13 Drawing Sheets

(51) Int. Cl.
*G06K 9/62* (2006.01)
*G01R 33/565* (2006.01)
*G01R 33/563* (2006.01)
*G01R 33/56* (2006.01)
*G01R 33/561* (2006.01)

(52) U.S. Cl.
CPC ............ *G06K9/6218* (2013.01); *G06T 7/0012* (2013.01); *G01R 33/561* (2013.01); *G01R 33/5608* (2013.01); *G06K 2209/05* (2013.01); *G06T 2207/10096* (2013.01); *G06T 2207/30048* (2013.01)

(56) References Cited

U.S. PATENT DOCUMENTS

| | | | |
|---|---|---|---|
| 5,402,067 A | 3/1995 | Pauly et al. | |
| 5,427,101 A | 6/1995 | Sachs et al. | |
| 5,485,086 A | 1/1996 | Meyer et al. | |
| 5,539,313 A | 7/1996 | Meyer | |
| 5,617,028 A | 4/1997 | Meyer et al. | |
| 5,650,723 A | 7/1997 | Meyer | |
| 5,957,843 A | 9/1999 | Luk et al. | |
| 6,020,739 A | 2/2000 | Meyer et al. | |
| 7,558,612 B2 | 7/2009 | Meyer | |
| 7,583,082 B1 | 9/2009 | Hu et al. | |
| 7,642,777 B1 | 1/2010 | Meyer et al. | |
| 7,888,935 B1 | 2/2011 | Tan et al. | |
| 8,026,720 B1 | 9/2011 | Chen et al. | |
| 8,094,907 B1 | 1/2012 | Meyer et al. | |
| 8,238,634 B1 | 8/2012 | Meyer et al. | |
| 8,306,289 B1 | 11/2012 | Meyer et al. | |
| 2003/0193337 A1 | 10/2003 | Meyer | |
| 2006/0034528 A1* | 2/2006 | Su et al. | 382/236 |
| 2008/0015428 A1 | 1/2008 | Epstein et al. | |
| 2008/0030587 A1* | 2/2008 | Helbing | 348/208.4 |
| 2009/0016610 A1* | 1/2009 | Ma et al. | 382/195 |
| 2010/0191099 A1 | 7/2010 | Salerno et al. | |
| 2011/0223103 A1 | 9/2011 | Beller | |
| 2012/0206597 A1* | 8/2012 | Komoto et al. | 348/135 |
| 2013/0035588 A1* | 2/2013 | Shea et al. | 600/413 |

OTHER PUBLICATIONS

Jung, Hong and Sung, Kyunghyun and Nayak, Krishna S. and Kim, Eung Yeop and Ye, Jong Chul, "k-t FOCUSS: A general compressed sensing framework for high resolution dynamic MRI", Magnetic Resonance in Medicine, vol. 61, pp. 1522-2594, Year 2009.*

Lustig, M. et al., "Sparse MRI: The Application of Compressed Sensing for Rapid MR Imaging," Magnetic Resonance in Medicine, 2007, 58(6), pp. 1182-1195, Wiley-Liss, Inc.

Gamper, U. et al., "Compressed Sensing in Dynamic MRI," Magnetic Resonance in Medicine, 2008, 59(2), pp. 365-373, Wiley-Liss, Inc.

Otazo, R. et al., "Combination of Compressed Sensing and Parallel Imaging for Highly Accelerated First-Pass Cardiac Perfusion MRI," Magnetic Resonance in Medicine, 2010 64(3), pp. 767-776, Wiley-Liss, Inc.

Jung, H. et al., "k-t FOCUSS: A General Compressed Sensing Framework for High Resolution Dynamic MRI," Magnetic Resonance in Medicine, 2009, 61(1), pp. 103-116, Wiley-Liss, Inc.

Adluru, G. et al. "Temporally Constrained Reconstruction of Dynamic Cardiac Perfusion MRI," Magnetic Resonance in Medicine, 2007, 57(6), pp. 1027-1036, Wiley-Liss, Inc.

Lingala, S. et al., "Accelerated Dynamic MRI Exploiting Sparsity and Low-Rank Structure: k-t SLR," IEEE Transactions on Medical Imaging, 2011, 30(5), pp. 1042-1054, IEEE.

Usman, M. et al., "Motion Corrected Compressed Sensing for Free-Breathing Dynamic Cardiac MRI," Magnetic Resonance in Medicine, 2013, 70, pp. 504-516, Wiley Periodicals, Inc.

Lingala, S. et al. "Motion compensated reconstruction for myocardial perfusion MRI," J Cardiovasc Magn R, 2012, 14(Suppl 1):M11, pp. 1-2, BioMed Central.

Adluru, G. et al., "A comparison of L1 and L2 norms as temporal constraints for reconstruction of undersampled dynamic contrast enhanced cardiac scans with respiratory motion," Proceedings of ISMRM, 2008, 16, p. 340.

Lingala, S. et al., "Unified Reconstruction and Motion Estimation in Cardiac Perfusion MRI," 2011, pp. 65-68, IEEE.

Simpson, I. et al., "Cine Magnetic Resonance Imaging for Evaluation of Anatomy and Flow Relations in Infants and Children with Coarctation of the Aorta," Circulation, 1988, 78(1), pp. 142-148, American Heart Association, Inc.

Lustig, M. et al., "k-t SPARSE: High frame rate dynamic MRI exploiting spatio-temporal sparsity," Proceedings of ISMRM, 2006, 14, p. 2420.

Aletras, a. et al., "DENSE: Displacement Encoding with Stimulated Echoes in Cardiac Functional MRI," J Magn Reson, 1999, 137(1), pp. 247-252, Elsevier Inc.

Zhao, B. et al., "PSF Model-Based Reconstruction with Sparsity Constraint: Algorithm and Application to Real-Time Cardiac MRI," Conf Proc IEEE Eng Med Biol Soc, 2010, pp. 3390-3393, IEEE.

Hansen, M. et al., "Retrospective Reconstruction of High Temporal Resolution Cine Images from Real-Time MRI Using Iterative Motion Correction," Magnetic Resonance in Medicine, 2012, 68(3), pp. 741-750, Wiley Periodicals, Inc.

Batchelor, P. et al., "Matrix Description of General Motion Correction Applied to Multishot Images," Magnetic Resonance in Medicine, 2005, 54(5), pp. 1273-1280, Wiley-Liss, Inc.

Asif, M. et al "Motion-Adaptive Spatio-Temporal Regularization or Accelerated Dynamic MRI," Magnetic Resonance in Medicine, 2013, 70(3), pp. 800-812, Wiley Periodicals, Inc.

Chen, X. et al., "Motion-Guided Temporally-Constrained Compressed Sensing for Dynamic MRI," Proceedings of ISMRM, 2012, 20, p. 1230.

Chen, X. et al. "Block LOw-rank Sparsity with Motion Guidance (BLOSM) for Accelerated Dynamic MRI," Proceedings of ISMRM, 2013, 21, p. 4555.

Bergen, J. et al., "Hierarchical Model-Based Motion Estimation," Lecture Notes in Computer Science 1992, 588, pp. 237-252.

Makela, T. et al., "A Review of Cardiac Image Registration Methods," IEEE Transactions on Medical Imaging, 2002, 21(9), pp. 1011-1021, IEEE.

Gotte, M. et al., "Quantification of Regional Contractile Function After Infarction: Strain Analysis Superior to Wall Thickening Analysis in Discriminating Infarct From Remote Myocardium," J Am Coll Cardiol, 2001, 37(3), pp. 808-817, Elsevier Science Inc.

Setser, R. et al., "Noninvasive assessment of cardiac mechanics and clinical outcome after partial left ventriculectomy," Ann Thorac Surg, 2003, 76(5), pp. 1576-1585, The Society of Thoracic Surgeons.

Buehrer, M. et al. "Array Compression for MRI with Large Coil Arrays," Proceedings of ISMRM, 2007, 15, p. 744.

Avants, B. et al., "A reproducible evaluation of ANTs similarity metric performance in brain image registration," Neuroimage, 2011, 54(3), pp. 2033-2044, Elsevier Inc.

Tustison, N. et al., "Diffeomorphic Directly Manipulated Free-Form Deformation Image Registration via Vector Fields Flows," Proceedings of the Fifth Workshop on Biomedical Image Registration, 2012, 7359, pp. 31-39, Springer-Verlag.

Thevenaz, P. et al., "Interpolation Revisited," IEEE Transactions on Medical Imaging, 2000, 19(7), pp. 739-758, IEEE.

Zhao, B. et al., "Low Rank Matrix Recovery for Real-Time Cardiac MRI," Biomedical Imaging: From Nano to Macro, 2010, pp. 996-999, IEEE.

Liang, Z-P., "Spatiotemporal Imaging with Partially Separable Functions," Proceedings of NFSI & ICFBI, 2007, pp. 988-991, IEEE.

Xue, H. et al., "Motion Correction for Myocardial T1 Mapping Using Image Registration with Synthetic Image Estimation," Magnetic Resonance in Medicine, 2012, 67(6), pp. 1644-1655, Wiley Periodicals, Inc.

Akcakaya, M. et al., "Low-Dimensional-Structure Self-Learning and Thresholding: Regularization Beyond Compressed Sensing for MRI Reconstruction," Magnetic Resonance in Medicine, 2011, 66(3), pp. 756-767, Wiley-Liss, Inc.

Akcakaya, M. et al., "Accelerated Contrast-Enhanced Whole-Heart Coronary MRI Using Low-Dimensional-Structure Self-Learning

(56) References Cited

OTHER PUBLICATIONS and Thresholding," Magnetic Resonance in Medicine, 2012, 67(5), pp. 1434-1443, Wiley Periodicals, Inc.
Vitanis, V. et al., "High Resolution Three-Dimensional Cardiac Perfusion Imaging Using Compartment-Based k-t Principal Component Analysis," Magnetic Resonance in Medicine, 2011, 65(2), pp. 575-587, Wiley-Liss, Inc.
Dillencourt, M. et al., "A General-Approach to Connected-Component Labeling for Arbitrary Image Representations," J Acm 1992, 39(2), pp. 253-280, ACM.
Majumdar, A. et al., "An algorithm for sparse MRI reconstruction by Schatten p-norm minimization," Magnetic Resonance Imaging, 2011, 29(3), pp. 408-417, Elsevier Inc.
Combettes, P. et al., "Signal Recovery by Proximal Forward-Backward Splitting," Multiscale Model Sim, 2005, 4(4), pp. 1168-1200, Society for Industrial and Applied Mathematics.
Dabov, K. et al., "Image Denoising by Sparse 3-D Transform-Domain Collaborative Filtering," IEEE Transactions on Image Processing, 2007, 16(8), pp. 2080-2095, IEEE.
Petzschner, F. et al., "Fast MR Parameter Mapping Using k-t Principal Component Analysis," Magnetic Resonance in Medicine, 2011, 66(3), pp. 706-716, Wiley-Liss, Inc.
Larson, A. et al., "Self-Gated Cardiac Cine MRI," Magnetic Resonance in Medicine, 2004, 51(1), pp. 93-102, Wiley-Liss, Liss, Inc.
Brinegar, C. et al., "First-Pass Perfusion Cardiac MRI Using the Partially Separable Functions Model with Generalized Support," Conf Proc IEEE Eng Med Biol Soc, 2010, pp. 2833-2836, IEEE.
Feng, X. et al., "Kalman Filter Techniques for Accelerated Cartesian Dynamic Cardiac Imaging," Magnetic Resonance in Medicine, 2012, 69(5), pp. 1346-1356, Wiley Periodicals, Inc.
Kim, D. et al., "Myocardial Tissue Tracking with Two-Dimensional Cine Displacement-Encoded MR Imaging: Development and Initial Evaluation," Radiology, 2004, 230(3), pp. 862-871, RSNA.
Yang, J. et al., "Alternating Direction Algorithms for L(1)-Problems in Compressive Sensing," Siam J Sci Comput, 2011, 33(1), pp. 250-278, Society for Industrial and Applied Mathematics.
Meyer, C. et al., "Fast Spiral Coronary Artery Imaging," Magnetic Resonance in Medicine, 1992, 28(2), pp. 202-213, Academic Press, Inc.
Liang, D. et al., "Accelerating SENSE Using Compressed Sensing," Magnetic Resonance in Medicine, 2009, 62(6), pp. 1574-1584, Wiley-Liss, Inc.
Kim, D. et al., "Accelerated Phase-Contrast Cine MRI Using k-t SPARSE-SENSE," Magnetic Resonance in Medicine, 2012, 67(4), pp. 1054-1064, Wiley-Liss, Inc.
Rasche, V. et al., "Resampling of Data Between Arbitrary Grids Using Convolution Interpolation," IEEE Transaction on Medical Imaging, 1999, 18(5), pp. 385-392, IEEE.

\* cited by examiner

SYSTEMS AND METHODS FOR ACCELERATED DYNAMIC MAGNETIC RESONANCE IMAGING

CROSS-REFERENCE TO RELATED APPLICATION

This Application claims priority to and benefit under 35 U.S.C §119(e) of U.S. Provisional Patent Application Ser. No. 61/761,496, entitled "System for Accelerated Dynamic MRI Using Block Low-Rank Sparsity with Motion Guidance (BLOSM) and Related Method," filed Feb. 6, 2013, which is hereby incorporated by reference in its entirety as if fully set forth below.

Some references, which may include patents, patent applications, and various publications, are cited in a reference list and discussed in the disclosure provided herein. The citation and/or discussion of such references is provided merely to clarify the description of the present disclosure and is not an admission that any such reference is "prior art" to any aspects of the present disclosure described herein. All references cited and discussed in this specification are incorporated herein by reference in their entireties and to the same extent as if each reference was individually incorporated by reference. In terms of notation, hereinafter, "(n)" may represent the nth reference cited in the reference list. For example, (5) represents the 5th reference cited in the reference list, namely, Adluru, G. et al., "Temporally Constrained Reconstruction of Dynamic Cardiac Perfusion MRI." Magnetic Resonance in Medicine. 57(6): 1027-1036.

STATEMENT OF RIGHTS UNDER FEDERALLY-SPONSORED RESEARCH

This invention was made with government support under grants R01 EB 0001763, R01 HL 115225, and K23 HL112910-02, awarded by the National Institutes of Health. The government has certain rights in the invention.

BACKGROUND

Dynamic imaging is commonly used in magnetic resonance imaging (MRI), and MRI acceleration techniques can provide enhanced spatial resolution, temporal resolution, and/or spatial coverage for these applications. Compressed sensing (CS), an acceleration technique of growing importance, is making a major impact on MRI (1). Using CS, high-quality images can be recovered from data sampled well below the Nyquist rate, provided that the sampling pattern is incoherent, the images are sparse in a transform domain, and a sparsity-promoting iterative reconstruction is used (1). Because of the high temporal and spatial redundancy inherent to dynamic contrast-enhanced MRI, these data can be represented sparsely in a transform domain and are suited for acceleration by CS (2). However, patient motion due to respiratory or other factors reduces the spatiotemporal redundancy of the data and, if not corrected, leads to image artifacts (3-11). The problem of imperfect breathholding and associated respiratory motion, for example, presents a major challenge to CS-acceleration of first-pass cardiac MRI where, even when patients are instructed to suspend respiration for 15-20 seconds, they are often unable to comply fully with instructions and they breathe during the scan.

A number of CS methods have been developed to accelerate dynamic MRI. Early studies such as k-t SPARSE showed that sparsity in the spatial and temporal frequency (x-f) domain could be exploited to accelerate cine MRI using CS (12,13). The k-t FOCal Underdetermined System Solver (k-t FOCUSS) method made improvements to x-f domain approaches by separating the data into predicted and residual signals, where the predicted signal served as a baseline signal and sparsity was exploited for the residual signal (4). While x-f domain methods combined with parallel imaging have been successfully used for dynamic contrast-enhanced MRI (3), the non-periodic nature of dynamic contrast-enhanced MRI leads to a broader band of temporal frequencies than cine MRI, thus these applications present less x-f sparsity than cine MRI. For these cases, data-driven spatiotemporal basis functions such as those used in Partially Separable Functions (14) and the k-t Sparsity and Low-Rank (k-t SLR) method (6) may have advantages. For example, the k-t SLR method, which is applied in the image-time domain and exploits matrix rank sparsity by decomposing the signal using singular value decomposition (SVD), has provided good image quality for accelerated contrast-enhanced cardiac perfusion imaging (6). However, even while advanced sparsifying transforms such as SVD provide improved image quality, these approaches are still subject to artifacts when respiratory motion or other patient movement occurs.

One approach to handle complex dynamics such as breathing is to extract motion information from the acquired data and apply motion compensation during CS reconstruction. Some studies (7,15) base their work on Batchelor's motion matrix method (16) to correct for respiratory motion in free-breathing or real-time cine imaging. While this approach separates cardiac and respiratory motion, the data binning step limits its extension to wider applications such as dynamic perfusion imaging and relaxation imaging. Another approach is to compensate the image dataset for motion and then apply a CS sparsity transform to the motion-compensated data, such as in k-t FOCUSS with motion estimation and compensation (4) and the recent method of Motion-Adaptive Spatio-Temporal Regularization (MASTeR) (17), as well as other methods (3,10,18). To date, these methods have employed the temporal difference or x-f methods as the sparsifying transform, and the results demonstrate advantages afforded by motion compensation.

It is with respect to these and other considerations that the various embodiments described below are presented.

SUMMARY

The present disclosure relates generally to magnetic resonance imaging (MRI), and more particularly to accelerated dynamic MRI.

In one aspect, the present disclosure relates to a method for motion compensation and regional sparsity in accelerated MRI. In an example embodiment, the method includes acquiring undersampled MRI data corresponding to a set of consecutive dynamic images associated with an area of interest of a subject, and defining the set of consecutive dynamic images as an initial set of estimated images. The method also includes separating an image of the initial set of estimated images into a plurality of image regions, and performing motion tracking for each image region of the plurality of image regions, throughout the initial set of estimated images, based at least in part on motion data associated with motion of the subject. The method also includes grouping the motion-tracked image regions into a plurality of clusters, based at least in part on spatial contents, and applying a sparsity transform to the plurality of clusters to form a plurality of sparsity-exploited, transformed image regions. The method also includes forming a set of merged images from the plurality of sparsity-exploited, transformed image regions, and updating the set of merged images based on data fidelity, to form an updated set of estimated images.

In another aspect, the present disclosure relates to a system which, in an example embodiment includes a magnetic resonance imaging (MRI) device, one or more processors, and at least one memory device coupled to the MRI device. The memory device stores computer-readable instructions that, when executed by the one or more processors, cause the system to perform functions that include acquiring undersampled MRI data corresponding to a set of consecutive dynamic images associated with an area of interest of a subject, and defining the set of consecutive dynamic images as an initial set of estimated images. The performed functions also include separating an image of the initial set of estimated images into a plurality of image regions, and performing motion tracking for each image region of the plurality of image regions, throughout the initial set of estimated images, based at least in part on motion data associated with motion of the subject. The performed functions also include grouping the motion-tracked image regions into a plurality of clusters, based at least in part on spatial contents, and applying a sparsity transform to the plurality of clusters to form a plurality of sparsity-exploited, transformed image regions. The performed functions also include forming a set of merged images from the plurality of sparsity-exploited, transformed image regions, and updating the set of merged images based on data fidelity, to form an updated set of estimated images.

In yet another aspect, the present disclosure relates to a non-transitory computer-readable medium. In one example embodiment, the computer-readable medium has stored computer-executable instructions that, when executed by one or more processors, cause a computer to perform functions that include acquiring undersampled MRI data corresponding to a set of consecutive dynamic images associated with an area of interest of a subject, and defining the set of consecutive dynamic images as an initial set of estimated images. The performed functions also include separating an image of the initial set of estimated images into a plurality of image regions, and performing motion tracking for each image region of the plurality of image regions, throughout the initial set of estimated images, based at least in part on motion data associated with motion of the subject. The performed functions also include grouping the motion-tracked image regions into a plurality of clusters, based at least in part on spatial contents, and applying a sparsity transform to the plurality of clusters to form a plurality of sparsity-exploited, transformed image regions. The performed functions also include forming a set of merged images from the plurality of sparsity-exploited, transformed image regions, and updating the set of merged images based on data fidelity, to form an updated set of estimated images.

Other aspects and features according to the present disclosure will become apparent to those of ordinary skill in the art, upon reviewing the following detailed description in conjunction with the accompanying figures.

DETAILED DESCRIPTION

Figure 1:
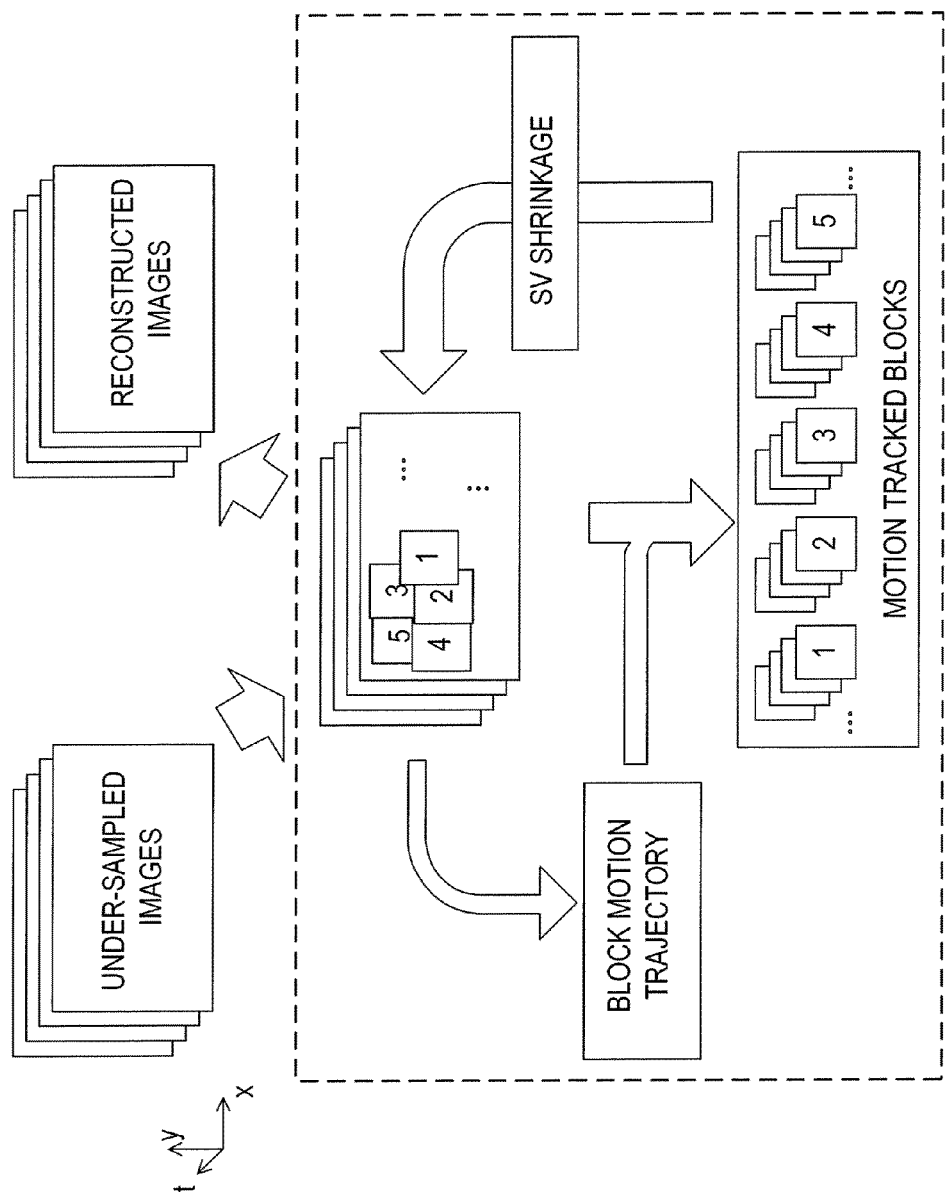
FIG. 1 is a diagram illustrating aspects of Block Low-rank Sparsity with Motion-Guidance (BLOSM) in accordance with an example embodiment of the present disclosure. As shown, a set of undersampled dynamic images are divided into blocks (labeled 1 to 5). Motion trajectories for each block are obtained from the current image estimation and utilized to track each block through time. The motion tracked blocks are stacked together to form a cluster for each group of blocks. Each cluster then undergoes a singular value shrinkage step and the resulting blocks are merged into a new estimated image, and the iterations continue for a fixed number of iterations or until a stopping criteria is met.

Aspects of the present disclosure relate to accelerated dynamic magnetic resonance imaging (MRI). Among other benefits and advantages, practicing aspects of the present disclosure in accordance with one or more example embodiments described herein provides for compressed sensing that utilizes advantages of data-driven spatiotemporal basis functions and regional motion tracking. According to some example embodiments, images may be divided (separated) into regions, the regions may be tracked over time, and singular value decomposition (SVD) may be applied to the tracked regions, which can both account for regional non-periodic variations in motion and can exploit regional spatiotemporal sparsity. In some example embodiments, the regions may be square blocks, and aspects of matrix low-rank sparsity are utilized. Accordingly, some aspects of the present disclosure are directed to what Applicants refer to as block low-rank sparsity with motion-guidance (BLOSM). BLOSM can utilize data-driven spatiotemporal basis functions applied to regions and achieve motion compensation by embedding regional motion tracking into the iterative compressed sensing (CS) image reconstruction algorithm. With this combination, BLOSM can attain benefits of data-driven spatiotemporal basis functions while substantially reducing artifacts from non-periodic motion such as breathing.

Although example embodiments of the present disclosure are explained in detail, it is to be understood that other embodiments are contemplated. Accordingly, it is not intended that the present disclosure be limited in its scope to the details of construction and arrangement of components set forth in the following description or illustrated in the drawings. The present disclosure is capable of other embodiments and of being practiced or carried out in various ways.

It must also be noted that, as used in the specification and the appended claims, the singular forms "a," "an" and "the" include plural referents unless the context clearly dictates otherwise.

In describing example embodiments, terminology will be resorted to for the sake of clarity. It is intended that each term contemplates its broadest meaning as understood by those skilled in the art and includes all technical equivalents that operate in a similar manner to accomplish a similar purpose.

As discussed herein, a "subject" or "patient" may be a human or any animal. It should be appreciated that an animal may be a variety of any applicable type, including, but not limited thereto, mammal, veterinarian animal, livestock animal or pet type animal, etc. As an example, the animal may be a laboratory animal specifically selected to have certain characteristics similar to a human (e.g. rat, dog, pig, monkey), etc.

It should be appreciated that the subject may be any applicable human patient, for example.

It is also to be understood that the mention of one or more steps of a method does not preclude the presence of additional method steps or intervening method steps between those steps expressly identified. Steps of a method may be performed in a different order than those described herein without departing from the scope of the present disclosure. Similarly, it is also to be understood that the mention of one or more components in a device or system does not preclude the presence of additional components or intervening components between those components expressly identified.

In the following description, references are made to the accompanying drawings that form a part hereof and that show, by way of illustration, specific embodiments or examples. In referring to the drawings, like numerals represent like elements throughout the several figures.

BLOSM and its related methods and systems, in accordance with various example embodiments of the present disclosure, are based on motion-guided compressed sensing using a regional approach to motion tracking and spatiotemporal sparsity. Some aspects of practicing aspects of BLOSM in accordance with example embodiments will now be described in further detail.

Figure 2:
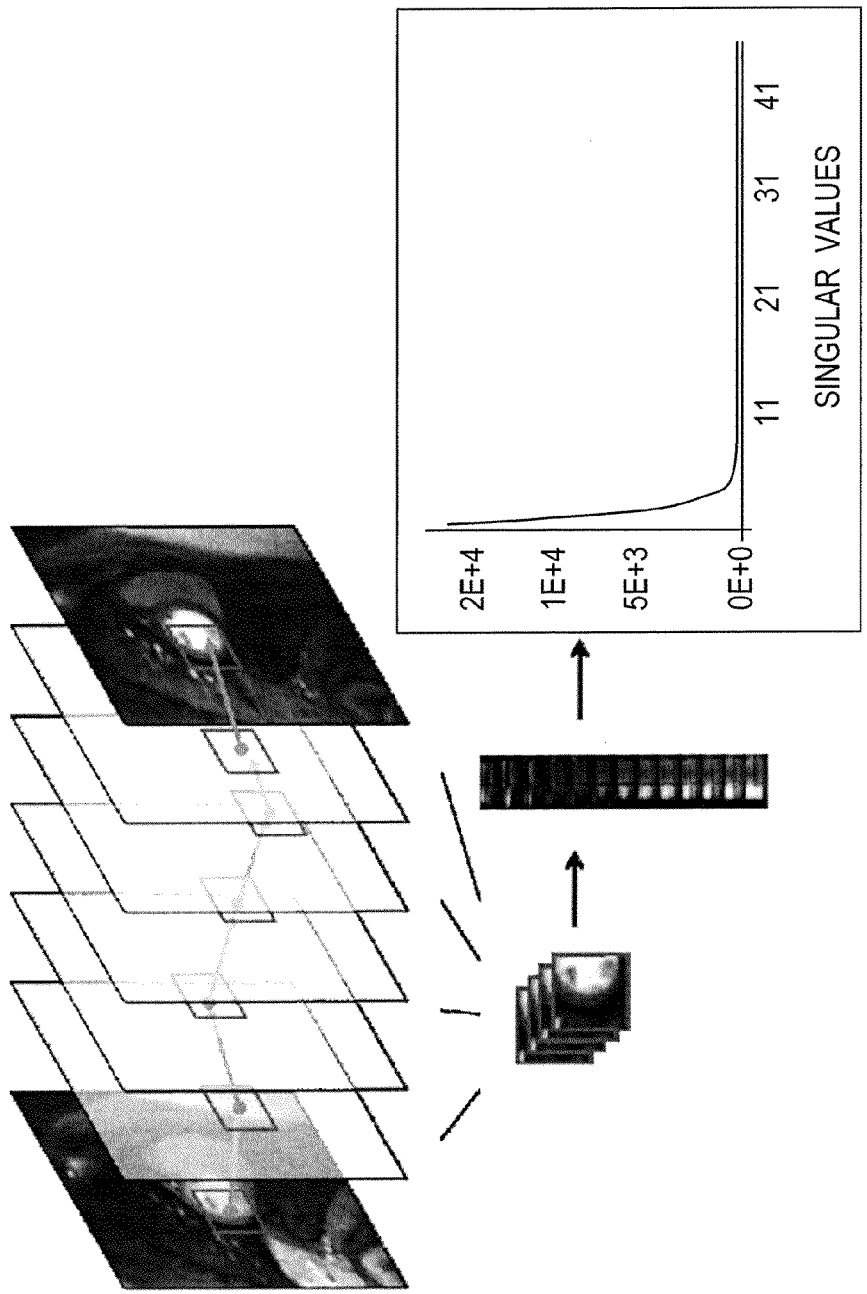
FIG. 2 illustrates aspects of tracking blocks of pixels and exploiting regional low-rank sparsity, in accordance with an example embodiment of the present disclosure. As shown, an example block of pixels is tracked throughout the frames. The temporally related blocks with similar spatial contents are gathered together to form a 3D ($N_b \times N_b \times N_t$) cluster. The cluster is rearranged into a 2D matrix ($N_s \times N_t$, $N_s = N_b \times N_b$), which has a high spatiotemporal correlation. Singular value decomposition (SVD) is applied to the matrix, and only a few of the singular values have significantly higher values than the others.

The BLOSM method according to certain example embodiments of the present disclosure is based on the concept of motion-guided compressed sensing using a regional approach to motion tracking and spatiotemporal sparsity. In BLOSM (as shown in FIG. 1), blocks of image pixels are defined on one image and tracked through time using motion maps extracted from the image data itself (not using separately acquired training data). The tracked blocks are then grouped into clusters which contain structurally-similar and temporally-related content. The clusters undergo SVD, image estimates are re-computed, and the algorithm iterates as shown. Because the clusters contain motion-tracked blocks, they exhibit decreased dynamic complexity and, correspondingly, increased matrix low-rank sparsity (19). Specifically referring to FIG. 2, a block (highlighted box) is initiated on the first image and is tracked to the succeeding images. Next, as also illustrated, the tracked blocks are gathered into a 3D cluster and rearranged into a 2D matrix, where each block becomes one column and blocks corresponding to separate time points are placed into separate columns. The 2D matrix is then subject to SVD to exploit low-rank sparsity. The 2D matrix has greater spatiotemporal sparsity compared to the whole image or to untracked blocks, since the blocks have a smaller scope with decreased spatiotemporal variations, and motion tracking leads to less motion contamination.

The CS reconstruction problem of BLOSM can be framed as the following constrained optimization problem:

$$\text{minimize}_{m,\mathcal{R}} \|\Phi_{\mathcal{R}} m\|_{p*}$$

$$s.t. \|\mathcal{F}_u m - d\|_2 \leq \epsilon \quad [1]$$

where m represents the estimated dynamic images, d is the acquired undersampled k-space data, and $\mathcal{F}_u$ is the undersampled Fourier transform which only takes values at the k-space positions where the d are acquired. $\Phi_{\mathcal{R}}$ represents the operator for block tracking and creation of rearranged clusters, after m is divided into blocks which are tracked using displacement maps $\mathcal{R}$ $\|*\|_{p*}$ is a joint Schatten p-norm that exploits the regional low rank property.

There are several techniques that may be used to extract motion information from images (20-24), where displacements of moving objects relative to a reference image can be obtained. In some example embodiments of the present disclosure, displacement maps may be computed using the Advanced Normalization Tools (ANTS) registration toolbox (25,26), which includes a set of image registration methods. The inputs to ANTS are the complex images. From these inputs, the registration toolbox takes the magnitude of the complex images and outputs pixel-by-pixel displacement maps. For block tracking, the displacement Δu of each pixel may be obtained as $\Delta u = \mathcal{R}(u) \equiv (\Delta x, \Delta y, \Delta t)$ where $u=(x,y,t)$ is the pixel space-time position and the displacement operator $\mathcal{R}$ is obtained using ANTS.

Figure 3:
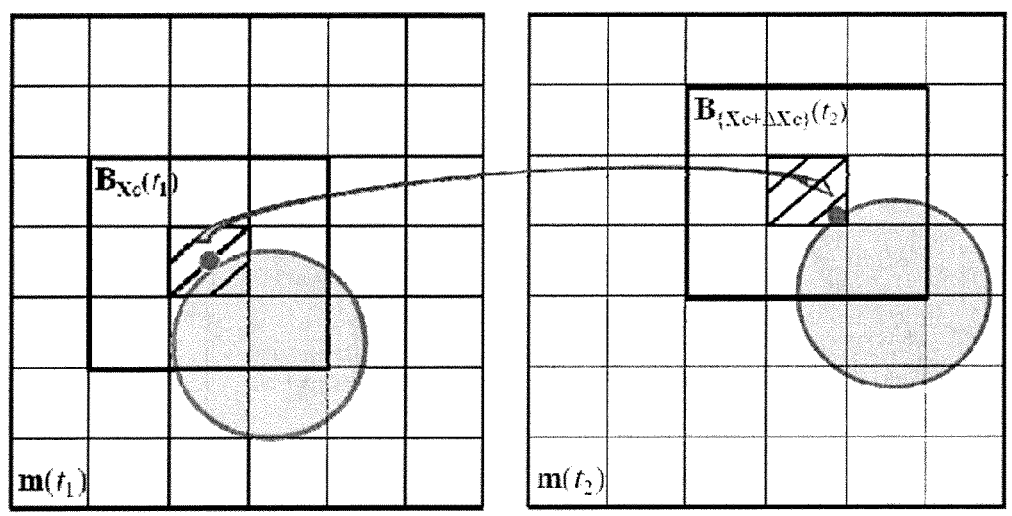
FIG. 3 illustrates aspects of block tracking in accordance with an example embodiment of the present disclosure. As shown, $m(t_1)$ and $m(t_2)$ are two consecutive dynamic images. An object (gray circle) is displayed on both images which underwent a translational shift (rightward and upward) from frame to frame. A point is labeled on the circle to represent part of the object. A block $B_{xc}(t_1)$ centered at the point is initiated on $m(t_1)$. The point is tracked from $m(t_1)$ to $m(t_2)$, as shown by the arrow. As shown, the tracked point on $m(t_2)$ is not at the center of the pixel. Instead of a spatial interpolation, the pixel containing the dot (the shaded pixel) is selected as the new center pixel for the block. The neighboring pixels are then included to form a tracked block on $m(t_2)$ as $B_{\{xc + \Delta xc\}}(t_2)$, where $u_2 = \{u_1 + \Delta u_1\}$.

In BLOSM, blocks may be initiated on the first image and motion tracking applied to each block. For example, consider one block $B(u_1) \in \mathbb{C}^{N_b \times N_b}$, where $u_1=(x_1,y_1,t_1)$ indicates that the block center was at position $(x_1,y_1)$ at time frame $t_1$. The displacement $\Delta u_1$ of the block center pixel may be obtained from the displacement map as $\mathcal{R}(u_1)$ and the tracked pixel location is then $u_1 + \mathcal{R}(u_1)$. The displacement operator $\mathcal{R}$ is calculated globally using the whole image and that $\mathcal{R}(u_1)$ and $u_1 + \mathcal{R}(u_1)$ may be non-integer numbers. Instead of performing a spatial interpolation to get the tracked pixel location as in conventional image registration, the tracked center from $u_1$ may be taken as $u_2 = \{u_1 + \mathcal{R}(u_1)\}$, where "{ }" takes the integer. A new block $B(u_2)$ may be defined to include all neighboring pixels around $u_2$ with the same block size, as illustrated in FIG. 3. $B(u_2)$ is then motion tracked to succeeding frames with the block center at $u_n = \{u_{n-1} + \mathcal{R}(u_{n-1})\}$ on the $n_{th}$ frame. The tracked blocks are collected as a cluster $\Xi = [B(u_1), B(u_2), \ldots B(u_{Nt})]$ with dimension of $N_b \times N_b \times N_t$. $\Phi_{\mathcal{R}}$ m yields a set of clusters $\Xi = [\Xi_1, \Xi_2, \ldots]$ and obtained by performing the block motion tracking procedure for each block defined on the first frame and tracked through all subsequent frames. This approach avoids spatial interpolation, which often leads to image blurring (27).

Matrix rank sparsity has been used previously for dynamic CS reconstruction (6,28-30), with one example being the k-t SLR method. According to example embodiments of the present disclosure, matrix rank sparsity is applied to the entire image dataset. Recent studies such as Low-dimensional-structure Self-learning and thresholding (LOST) (31,32) and compartment-based k-t Principal Component Analysis (33) show that separating an image dataset into different regions may increase spatiotemporal sparsity and improve reconstruction quality. Along these lines, Applicants use, in some example embodiments, matrix rank sparsity applied regionally by using SVD on tracked regions of dynamic datasets. Specifically, SVD is applied separately on each cluster $\Xi \in \mathbb{C}^{N_b \times N_b \times N_t}$. Each $\Xi$ is rearranged into a matrix $Z \in \mathbb{C}^{N_s \times N_t}$ ($N_s = N_b \times N_b$) where each block becomes one column. Then, Z is decomposed as $Z = U\Sigma V^*$ by SVD. The diagonal of $\Sigma \in \mathbb{C}^{N_s \times N_t}$ consists of singular values γ which, if the block is truly low rank, will have fewer significant values than the rank of Z.

According to an example embodiment of the present disclosure, Applicants use a variable-density sampling pattern with full sampling of the central phase-encode lines and random undersampling of the outer phase-encode lines. The total number of collected $k_y$ lines are the fully sampled number divided by the acceleration rate, and 50% of the total acquired lines are sampled around the center of k-space. Using this approach, the initial image estimate may have very low spatial resolution, and, as the algorithm iterates, the spatial resolution increases. Applicants developed a coarse-to-fine strategy to take advantage of this behavior, where smaller blocks and finer motion tracking (i.e., registration methods) are used as the algorithm iterated and image resolution improved. Specifically, an initial reconstruction may be performed where no motion estimation is used for the first 50 iterations. Through the subsequent iterations, smaller block sizes and a finer registration method are used for motion estimation. Given the dimensions of the images as $N_x \times N_y \times N_t$, the initial block size may be set as ⅕ of the shorter spatial dimension. After 50 iterations, a mutual-information-based rigid registration method embedded within ANTS may be performed to obtain global translational shifts. After subsequent sets of 50 iterations, the block size may be decreased 1.5 times until the final block size reached 5×5 pixels. Motion information may be updated every 50 iterations. After 150 iterations, the rigid registration may be replaced with a cross-correlation-based non-rigid registration method using ANTS.

Figure 4:
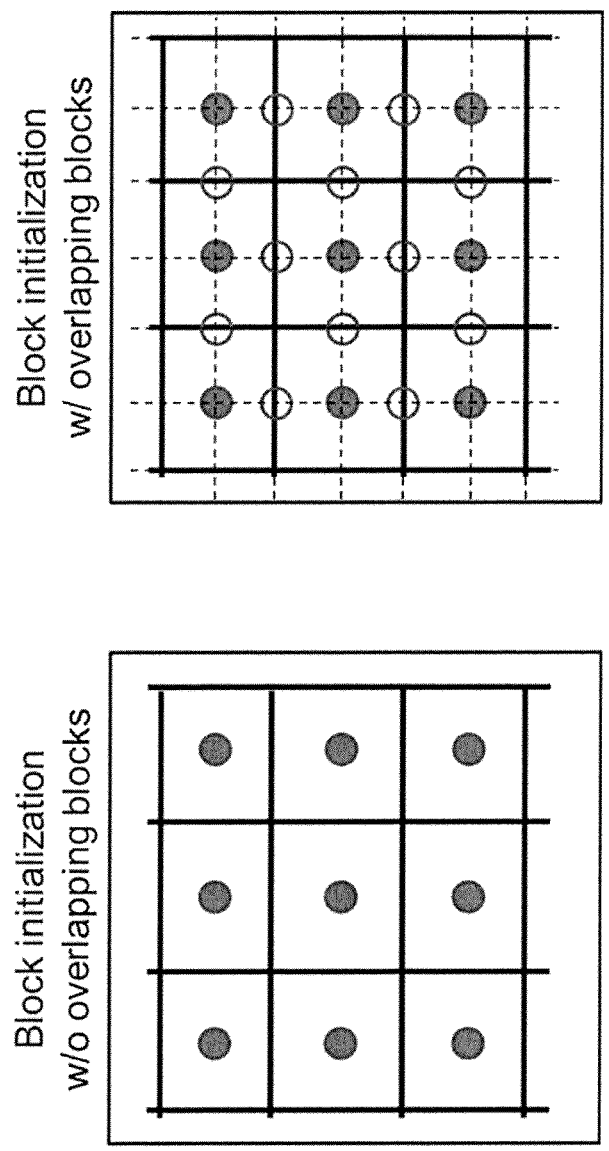
FIG. 4 illustrates block initialization with and without overlapping blocks, including aspects in accordance with an example embodiment of the present disclosure. In BLOSM, overlapping blocks may be used to avoid gaps. The circles in the figure represent block centers. The solid centers represent initial blocks that cover the whole image, and the unfilled circles represent additional blocks. The initial blocks are demarcated by solid lines, and the additional blocks, which overlap the initial blocks, are demarcated by dashed lines.

According to an example embodiment of the present disclosure, to ensure that gaps are not left between tracked blocks, Applicants use highly overlapping blocks and a gap detection and filling method. After defining the initial blocks, a second set of blocks, shifted by half the block size, is also defined and used (FIG. 4). In addition, during execution of BLOSM, images are automatically inspected for gaps and additional blocks are generated to cover gaps if they appear. Specifically, on the $n_{th}$ frame after block motion tracking, a mask of uncovered areas or "gaps" is calculated as $G_n$. A "common" gap mask $G_c$ is generated by taking the union set (along the temporal direction) of all the gap masks: $G_c = G_1 \cup G_2 \cup \ldots G_{Nt}$. $G_c$ is then used for each frame to get the pixels belonging to the gaps. Spatially discontinuous gaps are separated using connected component analysis (34) and are treated as different gap blocks at different spatial locations. Gap blocks at the same spatial location on different frames are gathered together into a 3D block cluster, which is further transformed into a 2D matrix and subjected to SVD, in the same manner as the other block clusters. No motion tracking is performed for the gap blocks in order to avoid potential additional gaps that might occur if the gap blocks were tracked.

A solution to the constrained optimization problem of Eq. 1 can be obtained by solving the following unconstrained Lagrangian problem using a diminishing λ through the iterations (35)

$$m^* = \arg\min_{m, \mathcal{R}} \|\mathcal{F}_u m - d\|_2 + \lambda \|\Phi_\mathcal{R} m\|_{p^*} \quad [2]$$

An iterative soft-thresholding (IST) algorithm (36) is adopted to solve Eq. 2. Specifically, for the $i_{th}$ iteration, the following steps are taken:

1. $m^* = \mathcal{S}_w(\mathcal{D}_{\lambda,p}(\Phi_\mathcal{R} m^i))$ [3]

2. $m^i = m^{i-1} + \delta \mathcal{F}^{-1}(d - \mathcal{F} m^*)$ [4]

where $\mathcal{D}_{\lambda,p}$ is a singular value soft thresholding operator defined as $$\mathcal{D}_{\lambda,p}(Z) = \mathcal{D}_{\lambda,p}(U\Sigma V^*) = U \text{ soft}(\text{diag}(\Sigma), \lambda p |\text{diag}(\Sigma)|^{p-1}) V^* \quad [5]$$

and soft( ) is the well-known soft thresholding operation defined as $$\text{soft}(\gamma, \lambda p|\gamma|^{p-1}) = \text{signum}(\gamma)\max(0, \gamma - \lambda p(\gamma)^{p-1}) \quad [6]$$

$\mathcal{D}_{\lambda,p}$ is applied to every cluster generated by $\Phi_\mathcal{R} m^i$. $\mathcal{S}_w$ is a weighted averaging operator (37) which merges the blocks to form images. The weighting is calculated as the reciprocal of the number of times one pixel was overlapped by different blocks. m' is an auxiliary variable and δ is a fixed value step size. The calculation is set to have a fixed number of iterations.

Figure 11:
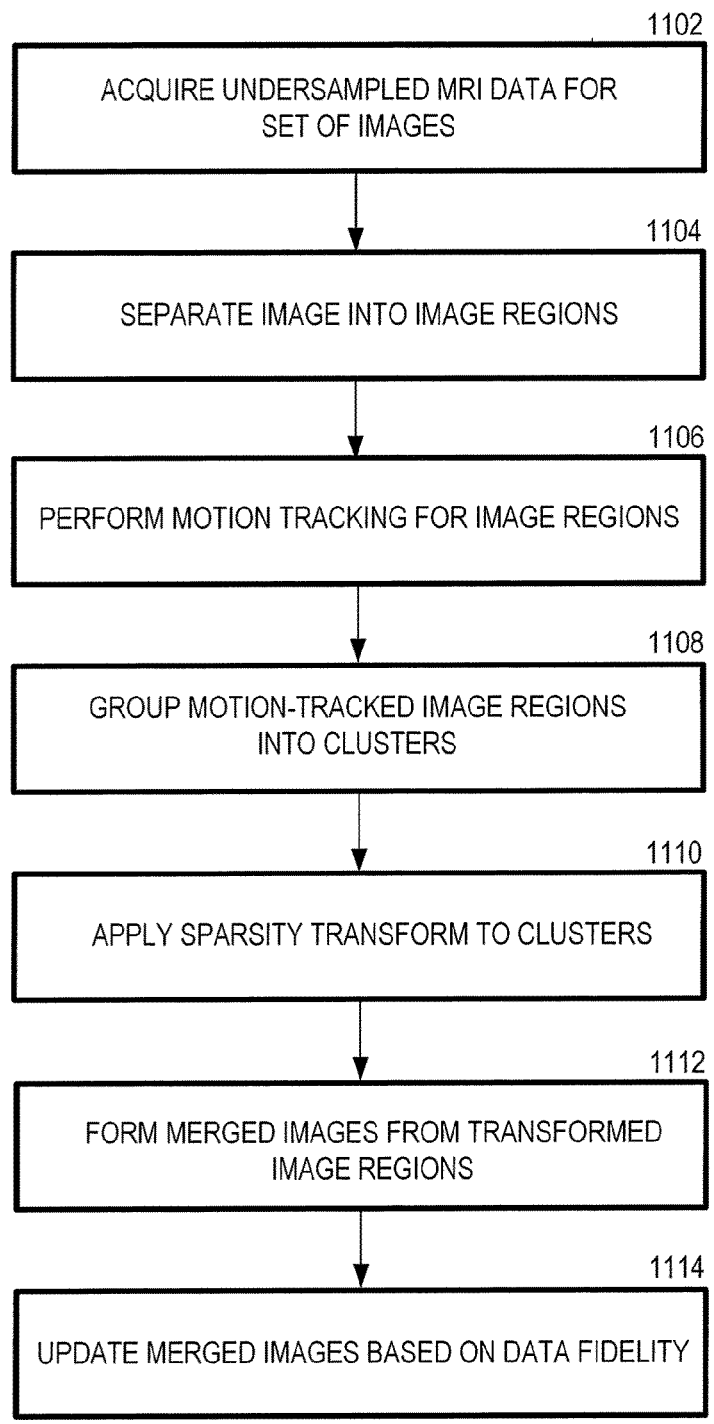
FIG. 11 is a flow chart illustrating operations of a method in accordance with an example embodiment of the present disclosure.
Figure 12:
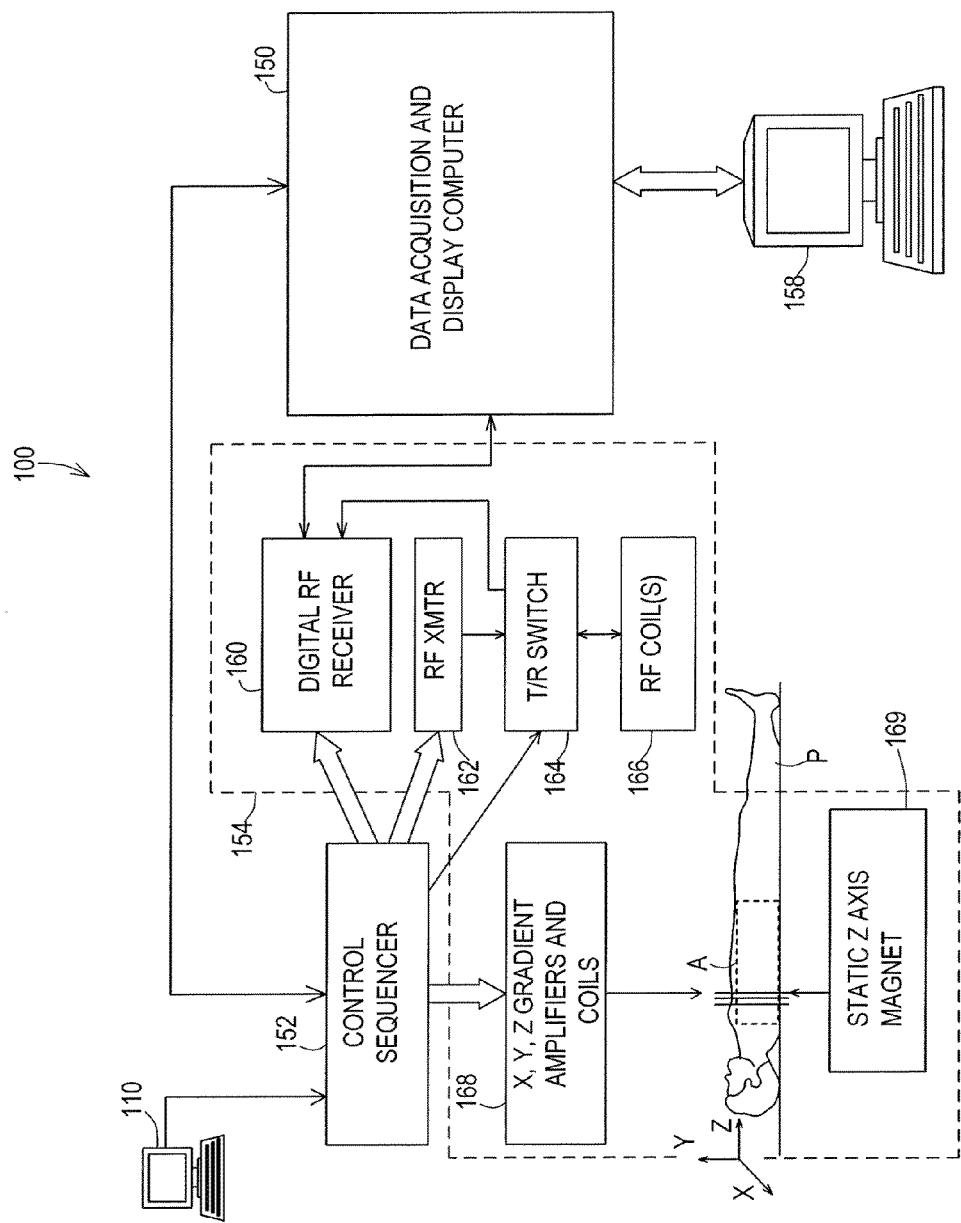
FIG. 12 is a system diagram illustrating an operating environment capable of implementing aspects of the present disclosure in accordance with one or more example embodiments.
Figure 13:
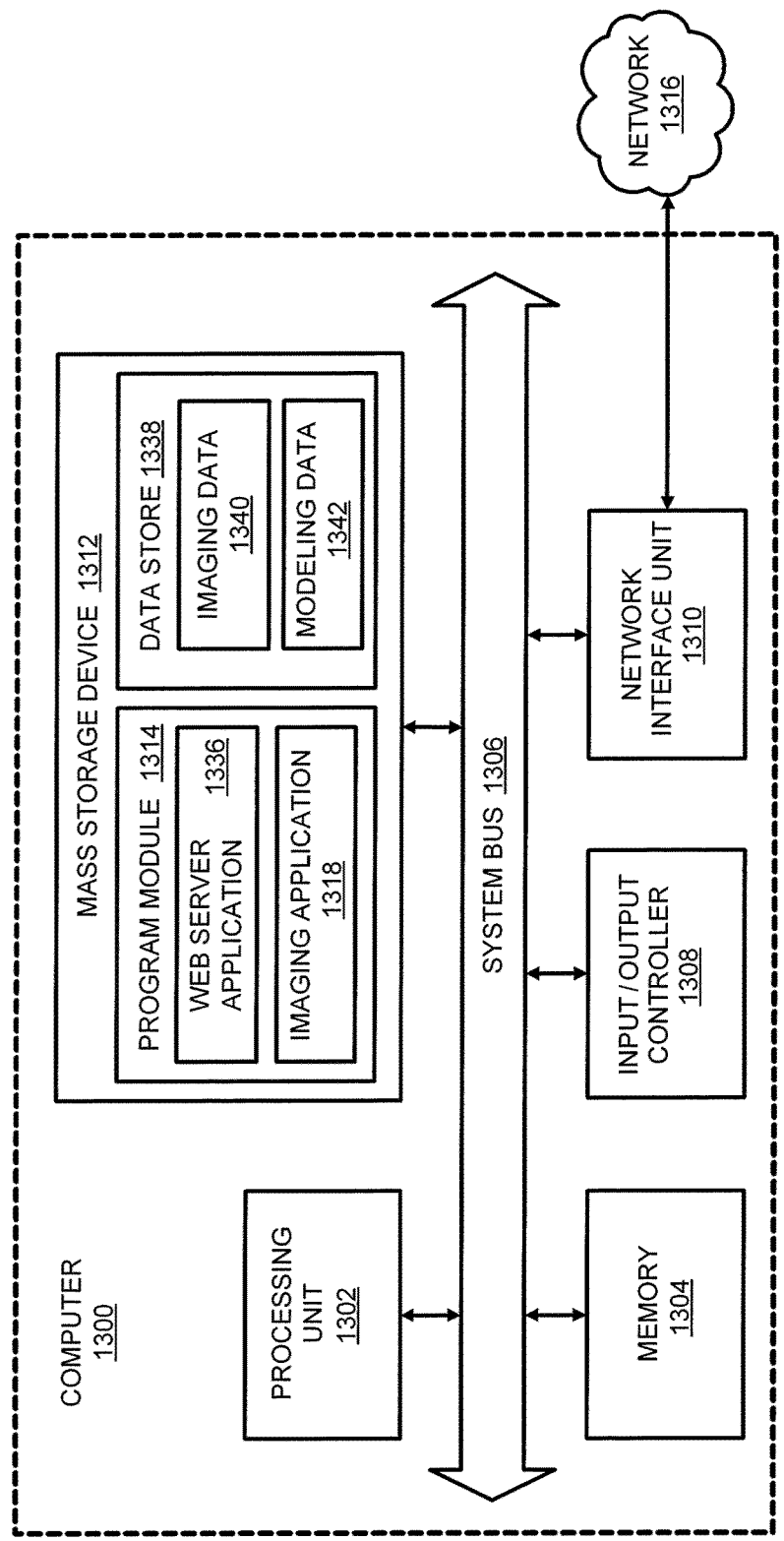
FIG. 13 is a computer architecture diagram illustrating computer hardware architecture for a computing system capable of implementing aspects of the present disclosure in accordance with one or more example embodiments.

Now referring to FIGS. 11-13, FIG. 11 is a flow diagram illustrating operations of a method 1100 according to an example embodiment of the present disclosure. The method 1100 includes, as shown at block 1102, acquiring undersampled magnetic resonance imaging (MRI) data corresponding to a set of consecutive dynamic images associated with an area of interest of a subject. The set of consecutive dynamic images may be defined as an initial set of estimated images. At block 1104, an image of the initial set of estimated images is separated into a plurality of image regions. Each of the image regions may correspond to a unique block of pixels. At block 1106, motion tracking is performed for each image region of the plurality of image regions, throughout the initial set of estimated images, based at least in part on motion data associated with motion of the subject. The motion data, which may correspond to respiratory activity and/or cardiac activity of the subject, may include motion trajectory data for each image region of the plurality of image regions, extracted from the acquired undersampled MRI data.

At block 1108, the motion-tracked image regions are grouped into a plurality of clusters, based at least in part on spatial contents, such as structurally-similar and temporally-related contents. At block 1110, a sparsity transform is applied to the plurality of clusters to form a plurality of sparsity-exploited, transformed image regions. Applying the sparsity transform to the plurality of clusters may include applying singular value decomposition (SVD) to the plurality of clusters. At block 1112, a set of merged images is formed from the plurality of sparsity-exploited, transformed image regions, and at block 1114, the set of merged images is updated based on data fidelity, to form an updated set of estimated images. Following block 1114, the updated set of estimated images formed at block 1114 can be defined as the initial set of estimated images, such as to, in a first iteration, replace the set of consecutive dynamic images acquired at block 1102 with the updated set of estimated images, such that the updated set of estimated images becomes the initial set of estimated images. The steps corresponding to blocks 1104-1114 may then be performed iteratively, on the respective initial set of estimated images formed by the respective set of updated estimated images for each iteration, until a predetermined condition is satisfied, for instance a predetermined number of iterations, predetermined period of time, and/or predetermined convergence level.

FIG. 12 is a system diagram illustrating an operating environment capable of implementing aspects of the present disclosure in accordance with one or more example embodiments. Embodiments may be implemented on a commercial MRI system. FIG. 12 illustrates an example of such an MRI system 1200, including a data acquisition and display computer 1250 coupled to an operator console 1210, an MRI real-time control sequencer 1252, and an MRI subsystem 1254. The MRI subsystem 1254 may include XYZ magnetic gradient coils and associated amplifiers 1268, a static Z-axis magnet 1269, a digital RF transmitter 1262, a digital RF receiver 1260, a transmit/receive switch 1264, and RF coil(s) 1266. The MRI subsystem 1254 may be controlled in real time by control sequencer 1252 to generate magnetic and radio frequency fields that stimulate magnetic resonance phenomena in a living subject, patient P, to be imaged. A contrast-enhanced image of an area of interest A of the patient P may be shown on display 1258.

The area of interest A corresponds to a region associated with one or more physiological activities in patient P. The area of interest shown in the example embodiment of FIG. 12 corresponds to a chest region of patient P. It should be recognized and appreciated that area of interest A can may correspond to, but is not limited to, one or more of a brain region, cardiac region, and upper or lower limb regions of the patient P. Display 1258 may be implemented through a variety of output interfaces, including a monitor, printer, or data storage.

It will be appreciated that any number and type of computer-based tomography imaging systems or components, including various types of magnetic resonance imaging systems, may be used to practice aspects of the present disclosure, and the disclosure should not be limited to the type of MRI subsystem shown in FIG. 12.

FIG. 13 is a computer architecture diagram showing illustrative computer hardware architecture for a computing system capable of implementing aspects of the present disclosure in accordance with one or more example embodiments described herein. An example implementation of the computer 1300 may include the data acquisition and display computer 1250 of FIG. 12. The computer 1300 includes a processing unit 1302 ("CPU"), a system memory 1304, and a system bus 1306 that couples the memory 1304 to the CPU 1302. The computer 1300 further includes a mass storage device 1312 for storing program modules 1314. The program modules 1314 may be operable to perform various operations discussed above with respect to FIGS. 1-11 and may include a web server application 1336 and an imaging application 1318. The computer can include a data store 1338 for storing data that may include imaging-related data 1340 such as image acquisition data, and a modeling data store 1342 for storing image modeling data, or other various types of data utilized in practicing aspects of the present disclosure.

The mass storage device 1312 is connected to the CPU 1302 through a mass storage controller (not shown) connected to the bus 1306. The mass storage device 1312 and its associated computer-storage media provide non-volatile storage for the computer 1300. Although the description of computer-storage media contained herein refers to a mass storage device, such as a hard disk or CD-ROM drive, it should be appreciated by those skilled in the art that computer-storage media can be any available computer storage media that can be accessed by the computer 1300.

By way of example, and not limitation, computer-storage media may include volatile and non-volatile, removable and non-removable media implemented in any method or technology for storage of information such as computer-storage instructions, data structures, program modules, or other data. For example, computer storage media includes, but is not limited to, RAM, ROM, EPROM, EEPROM, flash memory or other solid state memory technology, CD-ROM, digital versatile disks ("DVD"), HD-DVD, BLU-RAY, or other optical storage, magnetic cassettes, magnetic tape, magnetic disk storage or other magnetic storage devices, or any other medium which can be used to store the desired information and which can be accessed by the computer 1300.

According to various embodiments, the computer 1300 may operate in a networked environment using logical connections to remote computers through a network 1316. The computer 1300 may connect to the network 1316 through a network interface unit 1310 connected to the bus 1306. It should be appreciated that the network interface unit 1310 may also be utilized to connect to other types of networks and remote computer systems. The computer 1300 may also include an input/output controller 1308 for receiving and processing input from a number of input devices. The bus 1306 may enable the processing unit 1302 to read code and/or data to/from the mass storage device 1312 or other computer-storage media. The computer-storage media may represent apparatus in the form of storage elements that are implemented using any suitable technology, including but not limited to semiconductors, magnetic materials, optics, or the like.

The computer-storage media may represent memory components, whether characterized as RAM, ROM, flash, or other types of technology. The computer-storage media may also represent secondary storage, whether implemented as hard drives or otherwise. Hard drive implementations may be characterized as solid state, or may include rotating media storing magnetically-encoded information. The program modules 1314, which include the imaging application 1318, may include software instructions that, when loaded into the processing unit 1302 and executed, cause the computer 1300 to provide functions for accelerated dynamic MRI, according to aspects of the present disclosure described herein in accordance with example embodiments. The program modules may also provide various tools or techniques by which the computer 1300 may participate within the overall systems or operating environments using the components, flows, and data structures discussed throughout this description.

In general, the program modules 1314 may, when loaded into the processing unit 1302 and executed, transform the processing unit 1302 and the overall computer 1300 from a general-purpose computing system into a special-purpose computing system. The processing unit 1302 may be constructed from any number of transistors or other discrete circuit elements, which may individually or collectively assume any number of states. More specifically, the processing unit 1302 may operate as a finite-state machine, in response to executable instructions contained within the program modules 1314. These computer-executable instructions may transform the processing unit 1302 by specifying how the processing unit 1302 transitions between states, thereby transforming the transistors or other discrete hardware elements constituting the processing unit 1302.

Encoding the program modules 1314 may also transform the physical structure of the computer-storage media. The specific transformation of physical structure may depend on various factors, in different implementations of this description. Examples of such factors may include, but are not limited to the technology used to implement the computer-storage media, whether the computer storage media are characterized as primary or secondary storage, and the like. For example, if the computer-storage media are implemented as semiconductor-based memory, the program modules 1314 may transform the physical state of the semiconductor memory, when the software is encoded therein. For example, the program modules 1314 may transform the state of transistors, capacitors, or other discrete circuit elements constituting the semiconductor memory.

As another example, the computer-storage media may be implemented using magnetic or optical technology. In such implementations, the program modules 1314 may transform the physical state of magnetic or optical media, when the software is encoded therein. These transformations may include altering the magnetic characteristics of particular locations within given magnetic media. These transformations may also include altering the physical features or characteristics of particular locations within given optical media, to change the optical characteristics of those locations. Other transformations of physical media are possible without departing from the scope of the present description, with the foregoing examples provided only to facilitate this discussion.

Example Implementations and Results

The following describes examples of practicing concepts and technologies presented herein, and corresponding results, in accordance with aspects of the present disclosure.

Methods

To evaluate aspects of the BLOSM method according to example embodiments disclosed herein, Applicants used computer simulations and experimental first-pass contrast-enhanced cardiac MRI of human subjects. In both settings, retrospectively rate-4 undersampled images reconstructed using BLOSM were compared to fully-sampled data and to other CS methods. Since BLOSM uses SVD applied to motion-tracked regions, Applicants compared it to conventional k-t SLR (which uses SVD applied to non-motion-compensated whole images), BLOSM without block motion-guidance (BLOSM w/o MG), and k-t SLR with global motion-guidance (k-t SLR w/ gMG). The implementation of BLOSM w/o MG was straightforward. The blocks were treated as static and motion information was not estimated. Overlapping blocks were still generated. SVD was applied to each cluster of blocks. The implementation of k-t SLR was treated as BLOSM without motion guidance or blocks. k-t SLR w/ gMG exploited sparsity of the registered/motion compensated whole images. Specifically, for one iteration, the images were first compensated for motion by registering them to one reference image, which was the temporal average of the last 10 images. SVD was applied on the registered images. After the singular value shrinkage, the de-noised images were "registered back" for fidelity calculations since the original acquired data contained motion. These algorithms were all solved using IST, and no additional sparsity constraints were used. The weighting factor λ in front of the sparsity term was optimized independently for each of these three methods, as it was for BLOSM. Other parameters such as the norm p and the block size $N_b$ were selected to be the same as those used for BLOSM. BLOSM was also compared to k-t FOCUSS with motion estimation and compensation (k-t FOCUSS with ME/MC), since this is a motion-compensated CS method. The program code of k-t FOCUSS with ME/MC was obtained online (38). The five CS methods: BLOSM, k-t FOCUSS with ME/MC, k-t SLR, BLOSM w/o MG and k-t SLR w/ gMG were systematically compared.

Image quality for the various reconstruction algorithms was quantified using the root mean square error (RMSE) and the structure similarity (SSIM). RMSE measures the direct difference between the two images and is widely used for the assessment of CS methods (3-7,13,39). Applicants used the relative RMSE (rRMSE) defined as $$rRMSE = \frac{1}{N}\sqrt{\sum \frac{|x-y|^2}{|x|^2}} \quad [6]$$

where $N=N_x \times N_y \times N_t$, x are the fully-sampled images and y are the reconstructed images. Applicants also used the structural similarity index (SSIM), which is a more comprehensive measurement of the similarity between two images, and includes measurement of structure, intensity and contrast, representing human perception more closely (40). The equation for SSIM is $$SSIM(x,y) = \frac{(2\mu_x\mu_y + c_1)(2\sigma_{xy} + c_2)}{(\mu_x^2 + \mu_y^2 + c_1)(\sigma_x^2 + \sigma_y^2 + c_2)} \quad [7]$$

where x and y are the two images undergoing comparison, $\mu_x$ and $\sigma_x$ are the average and variance of x, $\sigma_{xy}$ is the covariance of x and y, and $c_1$ and $c_2$ are variables that stabilize the division with a weak denominator, chosen as described by Wang et al (40).

Computer simulations of heart-like phantoms with complex motions and signal intensity variations were used to evaluate aspects of BLOSM. Specifically, Applicants simulated objects undergoing rigid translational shifts along the phase-encoding and readout directions, objects undergoing both abrupt and gradual changes in size (which can be interpreted as either through-plane motion or cardiac contraction), objects undergoing appearance and disappearance (i.e., non-permanent features) and an object undergoing counterclockwise rotation. Motions were combined with temporally quadratically changing signal intensity. The images were Fourier transformed to generate k-space data, undersampled at acceleration rate 4 using the variable density $k_y$-t mask described above, and then reconstructed using various CS algorithms.

All imaging was performed on a 1.5T MR scanner (Avanto, Siemens, Erlangen, Germany). Eight different subjects with suspected heart disease were studied in accordance with protocols approved by our institutional review board after informed consent was obtained. For each subject a 5-channel phased-array RF coil was used and 1-4 short-axis slices were acquired each heartbeat for 50 repetitions during infusion of 0.075 mmol/kg gadopentetate dimeglumine (Magnevist, Bayer HealthCare, Montvale, N.J.). A saturation-recovery Turbo FLASH sequence was used with parameters as follows: nonselective 90° saturation pulse with a saturation recovery time of 100-120 ms, field of view=240-315×370-410 $mm^2$, matrix=86-152×128-200, slice thickness=8 mm, flip angle=8-15°, TR=1.9-2.2 ms, and TE=0.9-1.4 ms. Immediately prior to initiating the perfusion scan, each subject was instructed to suspend respiration during the scan using our standard instructions for breathholding. If the subjects could not hold their breath for the entire scan, they were instructed to breathe lightly for the remainder of the scan. As is typical for first-pass perfusion MRI of the heart, even with proper instructions about breathing, many patients do not comply well with the instructions, and various breathing patterns occur during perfusion imaging. The datasets collected and used in this study all present prominent respiratory motion, even though the patients were instructed not to breath. From the 8 patients studied, a total of 26 slices were collected, and each slice was treated as a distinct dataset. All data were acquired without prospective undersampling. Among the 26 datasets, 14 of them were fully-sampled sum-of-squares (SoS) combined magnitude-valued images and 12 of them were fully-sampled multi-coil complex-valued k-space data. In this study, we focused our efforts on evaluating BLOSM and other CS methods using only single-coil data. To serve this purpose, we combined the 12 multi-coil complex-valued k-space datasets into 12 single-coil magnitude-valued image data using SoS. The resulting 26 magnitude-valued datasets were transformed into k-space and retrospectively undersampled at acceleration rate 4 using the variable density $k_y$-t mask described above, and then reconstructed using various CS algorithms.

Systematic experiments were performed to determine whether the initial block size or block positions have an effect on image quality. The same datasets were reconstructed using different initial block sizes or positions. Specifically block size factors of 2, 3, 4, . . . , 10 were chosen, which correspond to initial block sizes of 51, 35, 27, . . . , 11 for an image matrix of 102*128. Due to the usage of the coarse-to-fine (CTF) strategy, where the block size decreases through the iterations and the registration method varied with iteration, the final block size was kept constant (5 for all settings), and the total iteration number was the same for different initial settings. Relative RMSE was calculated to perform a quantitative evaluation comparing the initial block sizes. Reconstruction time was also recorded. To assess whether there is a dependence on the initial block positions, BLOSM reconstructions using the original initial block positions and using shifted initial block positions (shifted by up to one quarter of the initial block size) were compared to reference images, where the reference images were fully-sampled 2DFT-reconstructed images. Experiments were also performed to demonstrate the utility of the CTF strategy. Both simulated and human datasets were reconstructed using BLOSM with and without the CTF strategy. In BLOSM without the CTF strategy, a constant block size and rigid registration method were used through all the iterations. Studies were also performed to show that motion guidance within BLOSM improves image quality. Both simulated and human datasets were used, which compared BLOSM with and without motion tracking.

Benchmark tests for BLOSM, k-t SLR and k-t FOCUSS with ME/MC were performed. All tests were performed in MATLAB on a desktop computer (3.4 GHz Intel® i7 CPU with 12 GB RAM). A human perfusion dataset with a matrix size of 102×128 and 44 time frames was used. A fixed number of 200 iterations was used for BLOSM and k-t SLR, and the k-t FOCUSS with ME/MC method used a convergence metric to terminate the algorithm. Benchmark tests showed the total computation times for BLOSM, k-t SLR and k-t FOCUSS with ME/MC for a given dataset were 986, 32, and 142 seconds, respectively. For BLOSM, 647 seconds were spent on motion estimation, 93 seconds on computing sparsifying transforms (SVD) and 210 seconds on block handling. Due to the coarse-to-fine strategy, BLOSM iterations were divided into 4 stages, where stage 1 had 60 blocks of size 21×21 pixels, stage 2 had 90 blocks of size 17×17, stage 3 had 154 blocks of size 13×13 and stage 4 had 216 blocks of size 11×11. The average computation times per iteration were 1.1±0.04, 1.5±0.04, 1.9±0.05 and 23±0.05 seconds for each stage, respectively.

Results

Figure 5:
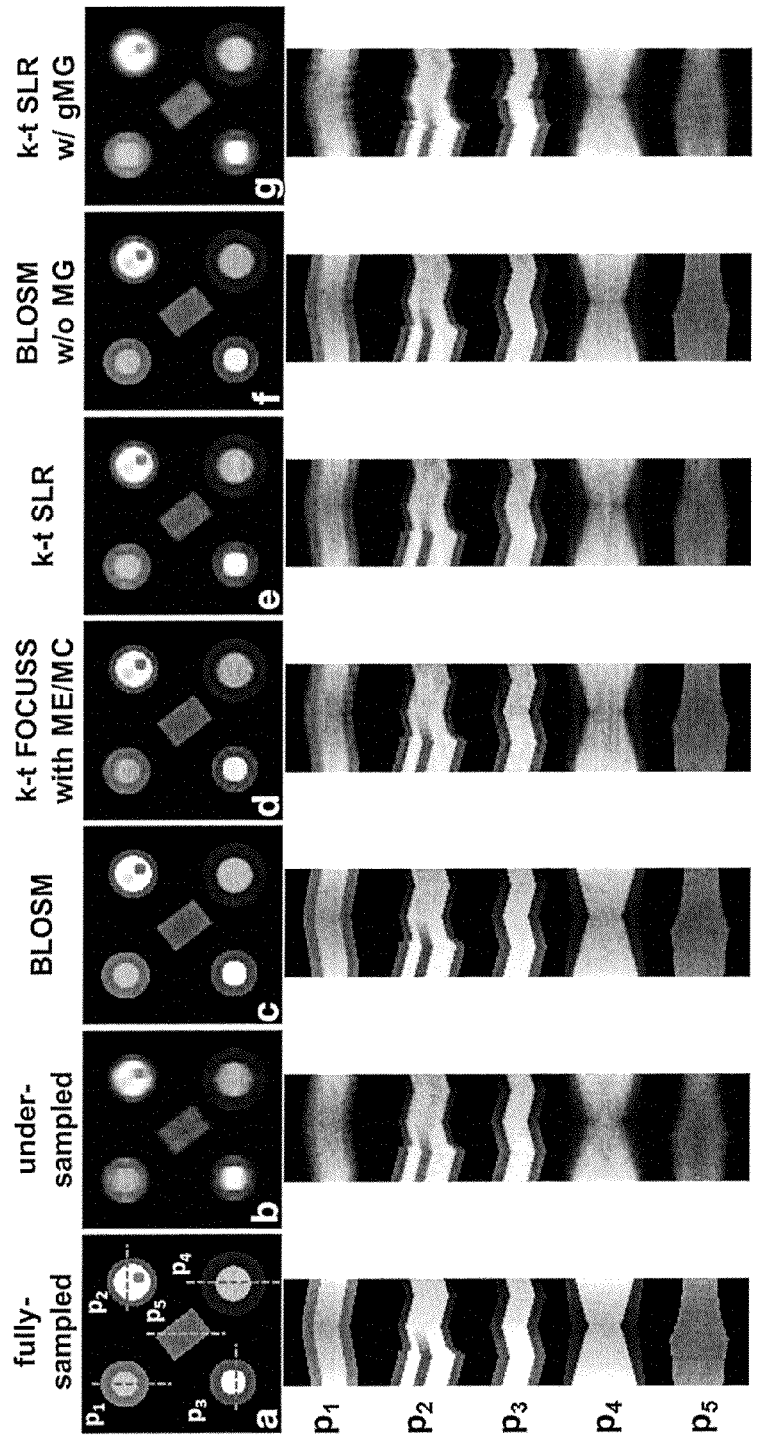
FIG. 5 illustrates reconstruction of retrospectively rate-4 under-sampled data from a computer-simulated phantom that undergo translational shifts, rotation, deformation, through-plane motion, and variable signal intensity over time, and including illustrations of aspects of BLOSM in accordance with example embodiments of the present disclosure. Example reconstructed images at one time frame are shown in the top row. Phantom 1 (P1) undergoes rigid translational shifts along the phase-encoding direction. P2 has an abrupt change in size as well as appearance/disappearance of features to mimic through plane motion combined with translational shifts in the readout direction. P3 undergoes rigid translational shifts along the readout direction. P4 undergoes a gradual change in size which can be interpreted as either cardiac contraction or through-plane motion. P5 rotates counterclockwise through time to mimic object rotation motion. All the phantoms also have quadratically changing signal intensity over time. Corresponding x-t profiles for each phantom (P1-P5) are shown on the bottom panel, where the profile locations are indicated by dashed lines on the fully-sampled image. The first column shows fully-sampled data reconstructed by FFT and serves as a reference. The other columns display undersampled data reconstructed using conventional FFT and the CS methods: BLOSM, k-t FOCUSS with ME/MC, k-t SLR, BLOSM without motion guidance (BLOSM w/o MG) and k-t SLR with global motion guidance (k-t SLR w/ gMG). BLOSM provided the most accurate recovery of the fully sampled images. For k-t FOCUSS with ME/MC, k-t SLR and BLOSM w/o MG, residual artifacts and moderate motion blurring can be observed, especially on P4.

FIG. 5 shows the comparison of BLOSM to other reconstruction algorithms for the computer-simulated phantoms. Example rate-4 accelerated CS-reconstructed images at one time point along with the fully-sampled reference and under-sampled FFT reconstructed images are shown on the top row. In FIG. 5, various motions were presented: rigid translational shifts along the phase-encoding direction (phantom 1, or P1) and readout direction (P3); translational shifts combined with an abrupt change in size and appearance/disappearance of non-permanent features (P2) and gradual change in size (P4), both of which can be interpreted as either through-plane motion or cardiac contraction; and object rotation (P5). Corresponding position-time (x-t) profiles are shown on the bottom row for each of the simulated phantoms. In the presence of object motion, signal intensity variation, and the appearance and disappearance of objects, visual inspection shows that images reconstructed using BLOSM most closely resemble the fully sampled images, as compared to the other CS methods. k-t FOCUSS with ME/MC and conventional k-t SLR had substantial residual artifact as well as some blurring. Some artifacts were more severe on k-t FOCUSS with ME/MC. BLOSM w/o MG removed more artifacts than conventional k-t SLR, which supports the concept of exploiting regional instead of global spatiotemporal sparsity. Edge artifacts along the direction of motion can be seen on BLOSM w/o MG, which are attributed to the lack of motion correction. k-t SLR w/ gMG had substantial smoothing effects. Relative RMSE and SSIM analysis showed that BLOSM achieved the minimum error and the maximum similarity (rRMSE=2.85E-8, SSIM=0.89) compared to k-t FOCUSS with ME/MC (rRMSE=6.30E-8, SSIM=0.66), k-t SLR (rRMSE=8.85E-8, SSIM=0.49), BLOSM w/o MG (rRMSE=6.50E-8, SSIM=0.78) and k-t SLR w/gMG (rRMSE=8.28E-8, SSIM=0.57).

Figure 6:
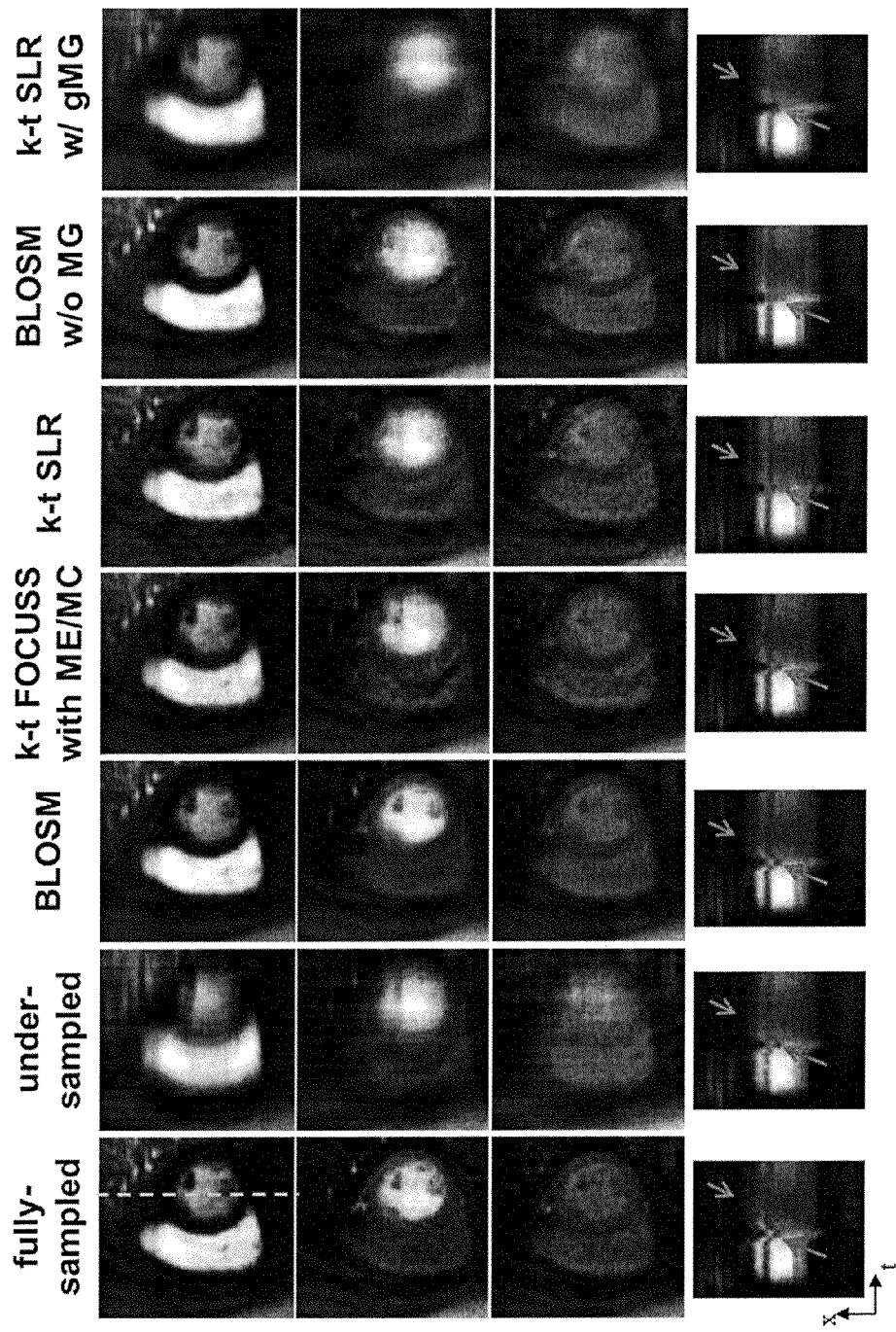
FIG. 6 illustrates results of implementations of BLOSM, according to example embodiments of the present disclosure, in comparison to other CS algorithms using retrospectively rate-4 undersampled first-pass contrast-enhanced MRI of the heart. Example frames are presented in different rows representing early, mid and late phases of contrast passage. Undersampled data are reconstructed by conventional FFT, BLOSM, k-t FOCUSS with ME/MC, k-t SLR, BLOSM without motion guidance (w/o MG) and k-t SLR with global motion guidance (w/ gMG). Respiratory motion occurred to a large degree during the middle phase (second row) and to a lesser degree at the late phase (third row). BLOSM provided the best image quality for all the phases and very closely matched the fully-sampled images. k-t FOCUSS with ME/MC, k-t SLR and BLOSM w/o MG performed fairly well for phases where there was no or little motion. For the mid phase, severe artifacts can be seen for k-t FOCUSS with ME/MC, k-t SLR and BLOSM w/o MG. k-t SLR w/ gMG resulted in blurred images for all phases. x-t profiles showing similar results are shown on the bottom row, with important dynamic features highlighted by arrows.

FIG. 6 shows representative results from first-pass contrast-enhanced perfusion images of the heart using different CS reconstruction methods. Images acquired at early, middle, and late phases of contrast enhancement are shown in different rows. Due to patient respiration, the heart shifted downward (~16 mm) in the middle row. Images from fully-sampled k-space data as well as rate-4 retrospectively-accelerated images reconstructed using conventional FFT, BLOSM and other CS methods are shown in separate columns. Visual inspection shows that BLOSM-reconstructed images resemble the fully-sampled data at all phases better than the other CS methods. Reconstruction methods without motion guidance, namely k-t SLR and BLOSM w/o MG (columns 3 and 4), show the inability to recover artifact-free images when motion occurs (row 2). k-t FOCUSS with ME/MC (row 2) had blurring and lower SNR as compared to BLOSM. k-t SLR w/ gMG had excessive blurring, similar to that seen in the simulated phantom, which propagated through many phases including phases with little or no motion. Motion recovery can also be appreciated by observation of the x-t profiles. As highlighted by the arrows, noise and artifacts were mostly removed without over-smoothing using BLOSM, while the other methods showed various artifacts and did not recover x-t profiles when motion occurred as accurately as BLOSM.

Figure 7:
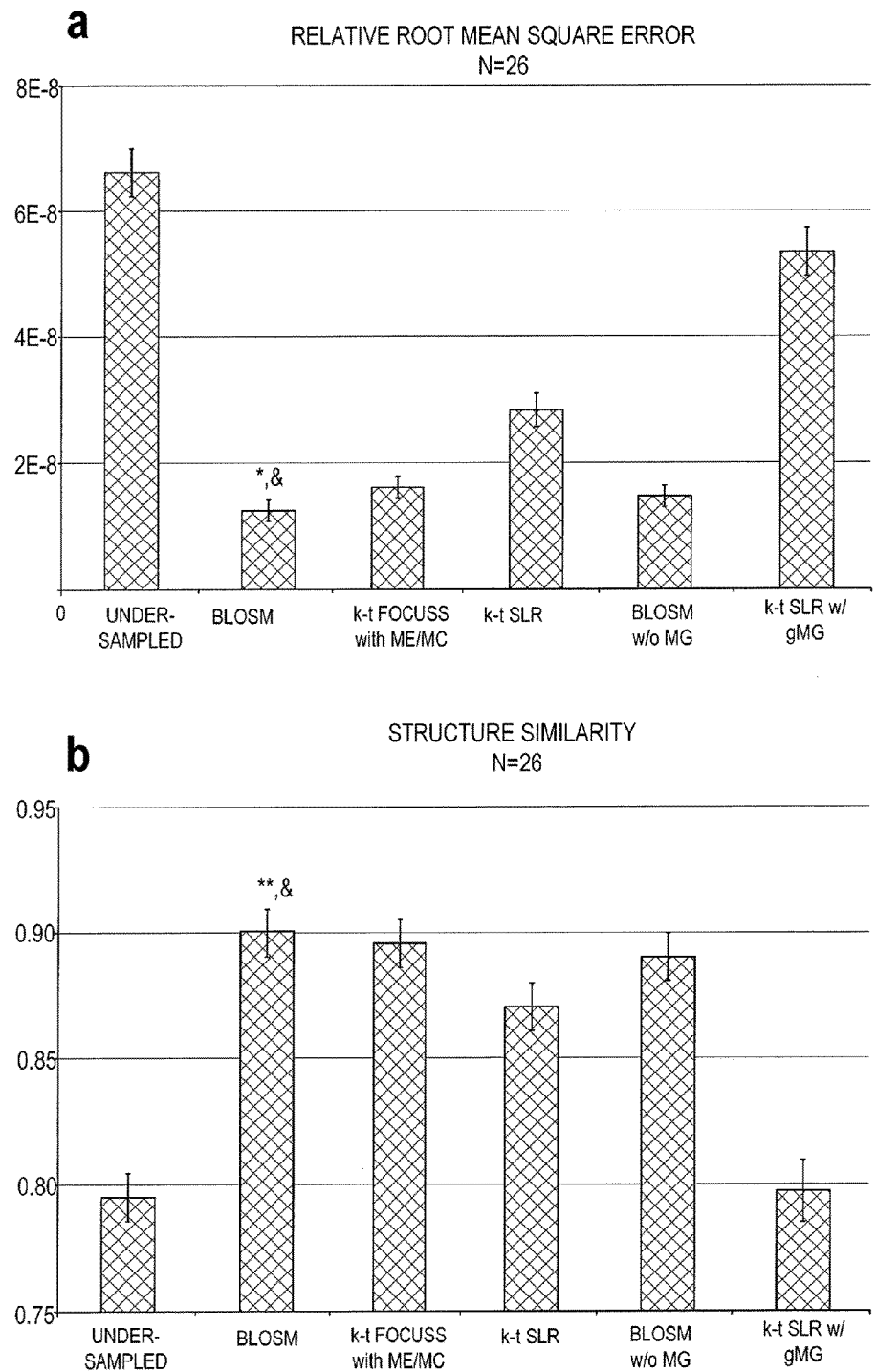
FIG. 7 illustrates a quantitative analysis of the performance of various reconstruction methods applied to rate-4 accelerated first-pass contrast-enhanced MRI of the heart, and including illustrations of aspects of the present disclosure according to example embodiments. Average relative root mean square error (rRMSE) and structural similarity (SSIM), averaged over time, of the CS-reconstructed images were compared to fully-sampled reference images. BLOSM achieved the lowest error (rRMSE) and highest similarity (SSIM) compared to the CS methods. (* $P<0.01$ v.s. undersampled, k-t FOCUSS with ME/MC, k-t SLR and k-t SLR w/gMG; & $P<0.05$ v.s. BLOSM w/o MG; ** $P<0.01$ v.s. undersampled, k-t SLR, and k-t SLR w/gMG; $ $P<0.05$ v.s. k-t FOCUSS with ME/MC).

The reconstructed images were analyzed quantitatively using rRMSE and SSIM. Values for 26 slices are shown in FIG. 7. BLOSM demonstrated the best reconstruction quality with the minimum rRMSE and the maximum value of SSIM ($p<0.05$ vs. all other methods, ANOVA)

Figure 8:
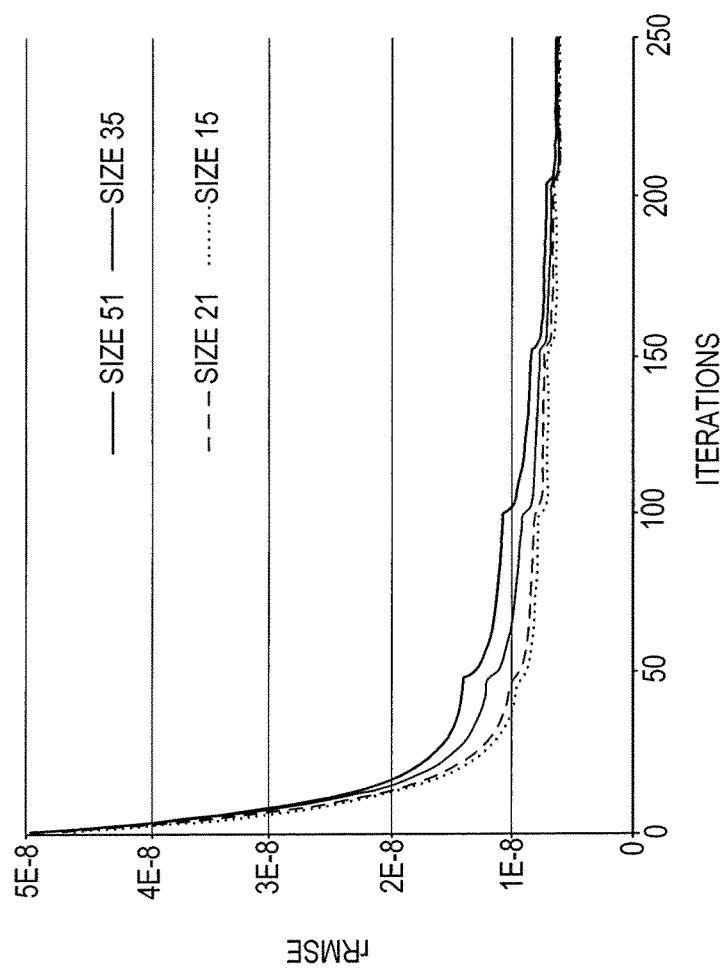
FIG. 8 illustrates convergence of BLOSM for various initial block sizes, according to example embodiments of the present disclosure. BLOSM using different initial block sizes was used to reconstruct a first-pass perfusion dataset. These rRMSE vs. iteration curves demonstrate that the convergence of BLOSM is essentially independent of the initial block size (not all tested initial block sizes are shown, but all had similar behavior).
Figure 9:
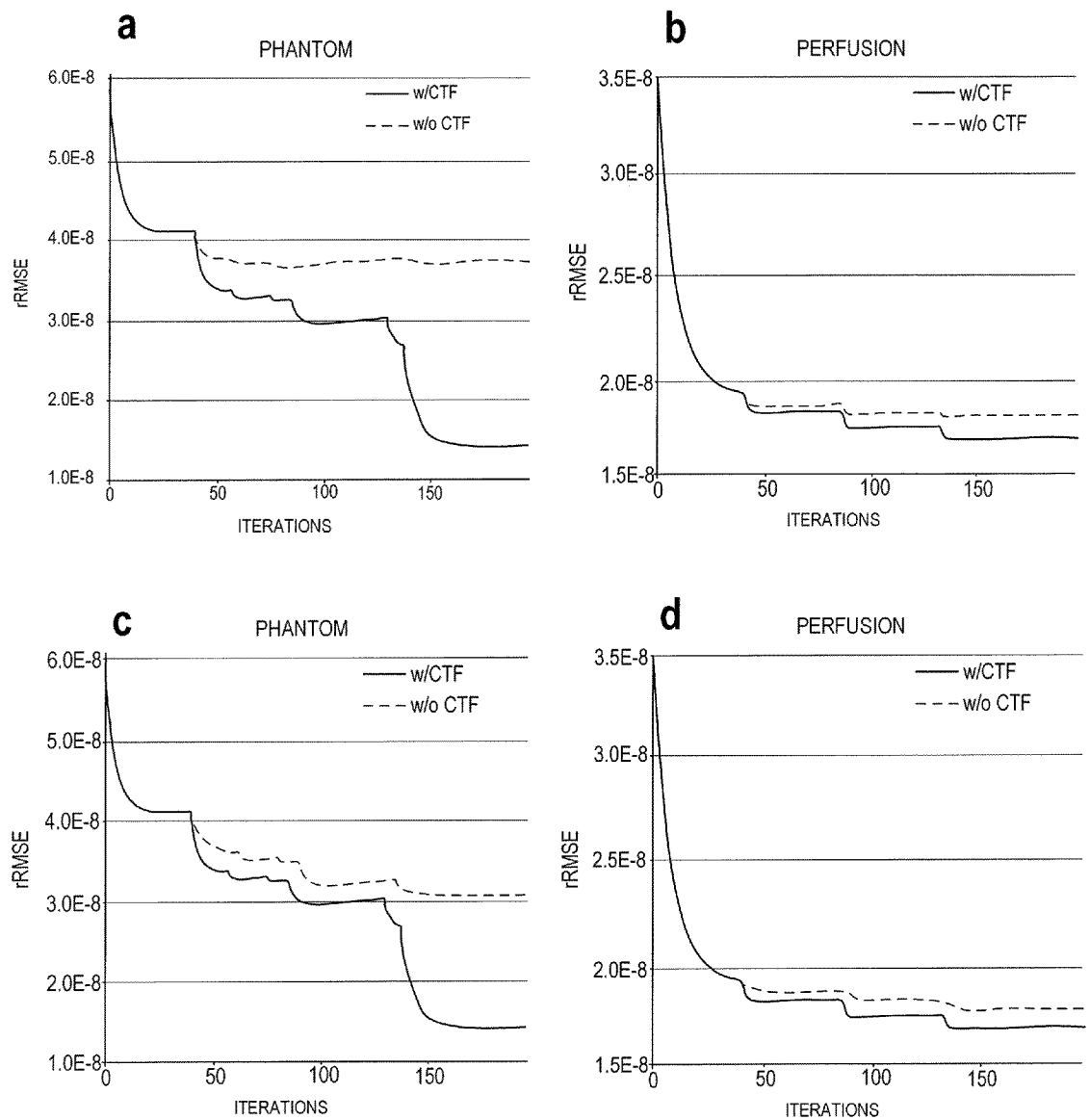
FIG. 9 illustrates convergence of BLOSM under various conditions, including aspects of in vivo perfusion imaging, in accordance with example embodiments of the present disclosure. Panels (A and B) show for both computer-simulated phantoms and in vivo perfusion imaging that the coarse-to-fine strategy provides lower rRMSE compared to not using this strategy. Similarly, panels (C and D) show that for both computer-simulated phantoms and in vivo perfusion imaging the use of motion guidance reduces rRMSE compared to not using motion guidance.
Figure 10:
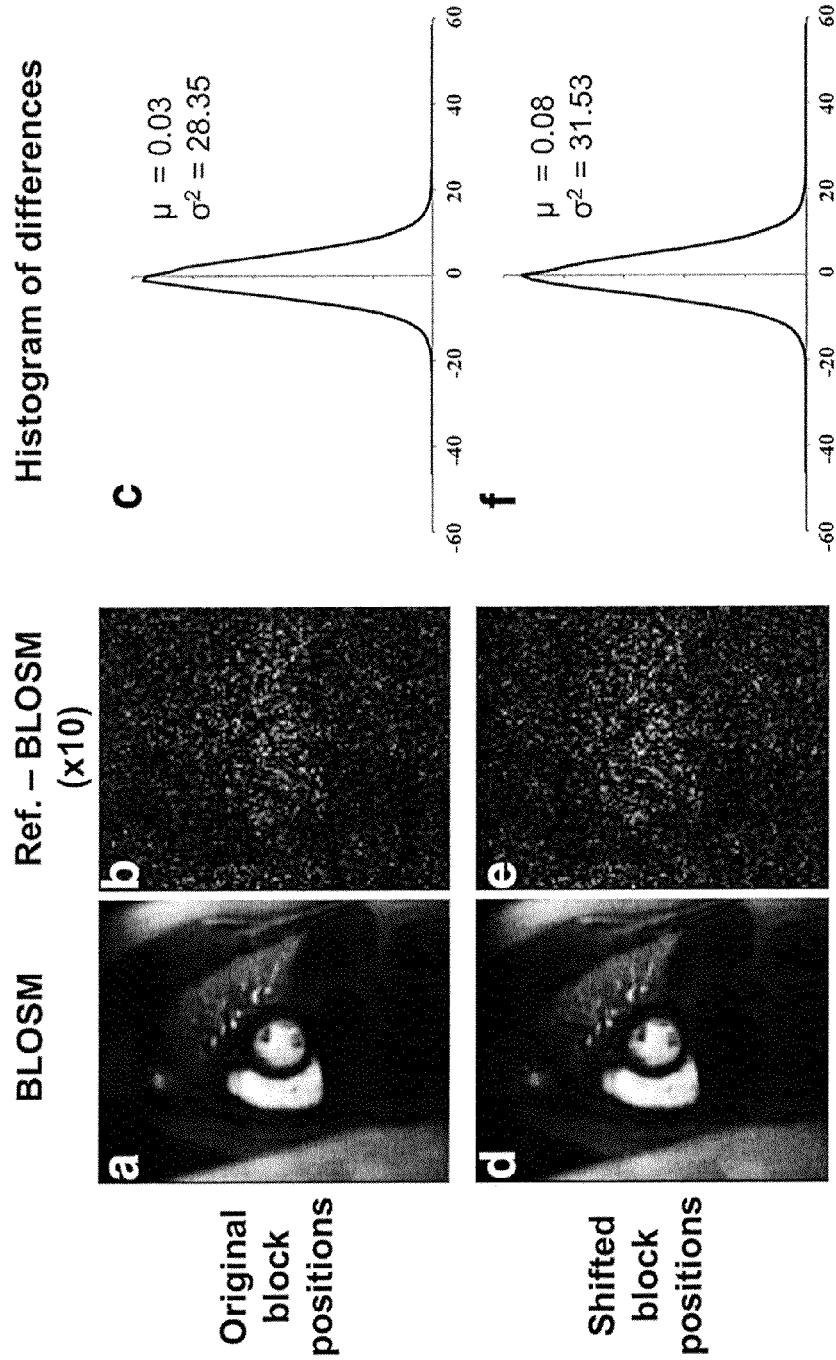
FIG. 10 illustrates aspects of BLOSM in accordance with example embodiments of the present disclosure, including images reconstructed using BLOSM and histograms from multiphase difference images. Image reconstruction using BLOSM is not highly dependent on the initial block positions. Images were reconstructed using BLOSM with original initial block positions (A) and with shifted initial block positions (D). The difference between a fully-sampled 2DFT-reconstructed image (Reference image) and (A) is shown in (B), and the difference between the reference image and (D) is shown in (E). Histograms from multiphase difference images using the original initial block positions and the shifted initial block positions are shown in (C) and (F), respectively. Using either the original initial block positions or the shifted initial block positions results in the same difference distribution (Gaussian distribution verified using the Jarque-Beta test) compared to the reference images. $\mu$ is the mean and $\sigma^2$ is the variance.

FIG. 8 plots rRMSE as a function of the BLOSM iteration number for different initial block sizes, and shows that BLOSM converges to a single rRMSE value independent of the initial block size. Thus, it may be that there is not a single optimal initial block size for BLOSM. Using similar plots, FIGS. 9A-9B demonstrate the benefits of the coarse-to-fine strategy, as use of the coarse-to-fine strategy reduces rRMSE in both phantom and human data. FIGS. 9C-D show the benefits of motion guidance, as BLOSM with motion tracking leads to reduced rRMSE as compared to BLOSM w/o MG. A number of abrupt transitions in rRMSE as a function of iteration are observed in FIG. 8, and correspond to coarse-to-fine adjustments of block size, registration method, and iterative soft thresholding values as BLOSM iterates. To quantify potential differences related to initial block positions, BLOSM using the original block positions and BLOSM using the shifted block positions were both compared to a reference image (a fully-sampled 2DFT-reconstructed image). As shown in FIG. 10, Applicants found a nearly identical difference distribution compared to the reference image for BLOSM using the original block positions and BLOSM using the shifted block positions.

Discussion and Conclusion

Applicants have developed a novel CS reconstruction technique, termed BLOSM, that exploits regional spatiotemporal sparsity and compensates for the effects of respiratory motion by embedding motion tracking within the reconstruction algorithm. Experiments comparing different reconstruction algorithms demonstrated that the regional approach with motion compensation combine to contribute to the superior performance of BLOSM. Visual inspection of images as well as quantitative assessments of image quality (rRMSE and SSIM) demonstrated the advantages of BLOSM.

Two key components of BLOSM, namely the use of both regional sparsity and motion tracking, work together to achieve improved image quality. The finding that BLOSM without motion guidance performed better than global k-t SLR demonstrated that regional sparsity has advantages over global sparsity when using SVD. This finding was also observed in previous work where compartment-based k-t PCA separated perfusion images into different parts (right ventricular blood pool, left ventricle, etc.) and achieved better image quality than conventional k-t PCA (33). In addition, BLOSM with motion guidance may perform better than BLOSM without motion guidance, showing advantages of the motion-guided regional approach.

Adequate motion tracking is central to the performance of BLOSM. Applicants chose to use the ANTS toolbox because it can handle various types of motion and deformation, even with changing signal intensity (25,26). Although in BLOSM blocks are tracked, the motion information used for block tracking is obtained by registering whole images, not by using a block matching algorithm, such as in k-t FOCUSS with ME/MC. Applicants used the displacement of the central pixel of the block to represent the whole block motion. The displacements in a region are expected to be smoothly changing, so the center pixel should be representative of the block. Also, Applicants' method for tracking blocks in BLOSM avoided the use of spatial interpolation. In contrast, Applicants' implementation of k-t SLR with global motion guidance included spatial interpolation steps in the sparsity calculation and in the fidelity calculation, and lead to blurring and smoothing. BLOSM avoids spatial interpolation, which contributed to its lack of blurring. BLOSM was evaluated using 2D imaging, and although it may be subject to minor errors when through-plane motion occurs, Applicants used computer simulations to investigate the behavior of BLOSM with through-plane motion and found that, while some minor blurring can occur, BLOSM still performed better than the other CS methods under these conditions. For alternative implementations, a frame rejection scheme and/or a 3D acquisition may be used in through-plane motion. As to effective motion tracking, Applicants combined motion tracking with SVD, which is known to be fairly tolerant to misregistration of serial images (6,14,41). The use of a block-tracking approach may lead to image regions that are not covered by tracked blocks, i.e., gaps. To avoid such a situation, Applicants use highly overlapping blocks and, if gaps do occur, they are detected and patched with additional blocks. Applicants' results also showed that BLOSM converges to a common RMSE independent of the initial block size, and that there is little effect of using different initial block positions on the resulting reconstructed images.

Applicants' resulting data also support the use of the coarse-to-fine strategy for BLOSM. As the BLOSM algorithm iterates, the spatial resolution of the estimated image improves and supports the use of finer motion estimation and use of smaller blocks. When comparing BLOSM with and without the coarse-to-fine strategy, rRMSE is lower when using this strategy. In the current implementation of BLOSM, the block size decreased and the registration method updated once for every fifty iterations, and these settings achieved good results. Alternative approaches to may include an estimate of displacement accuracy into the cost function and to adaptively weight motion-guidance, such that when the displacement estimation accuracy is low, less trust will be given to the current estimate and the previous estimate would be used instead. Such a strategy may be similar to the approach used with Kalman filters and may benefit tolerance to motion estimation error (42).

Free parameters for the CS problem were empirically varied to find a set that achieved low rRMSE. The Schatten norm, p, threshold value, $\lambda$, and block size, $N_b$, were optimized separately while fixing the other parameters. Parameter optimization was done for phantom and human data, and the optimal values were similar for both types of data, indicating that the algorithm is stable. With Schatten norm $p<=1$, Eq. 1 becomes a non-convex problem. Applicants found that optimal image quality was achieved with $p=0.9$, and this agrees with other results using the same Schatten norm applied to MR images of the brain (43). The threshold value for each block at singular value $\gamma$ is calculated as $\lambda p(\gamma)^{p-1}$ and the selection of $p=0.9$ enables a block-specific regularization since different blocks have different values of $\gamma$. Singular values which contain most of the energy and contrast will receive low penalties while small singular values which mainly correspond to noise and artifacts will receive higher penalties. When p is fixed, the weighting factor $\lambda$ in Eq. 6 controls the threshold and has a high impact on reconstruction quality. For each of the CS methods (BLOSM, BLOSM w/o MG, k-t SLR and k-t SLR w/ gMG) a range of $\lambda$ (0~2000) was independently tested using two datasets to find the optimal $\lambda$ that gave the minimum rRMSE. For the IST algorithm and using a diminishing of $\lambda$ through iterations, Applicants found that the final image quality was stable for a range of $\lambda$ values (20~200) even with changes in other experimental parameters, such as the norm p. When an aggressive $\lambda$ value (>500) was chosen, over-regularization was observed as block-like artifacts. Other recent methods exploiting regional sparsity (31,33,37) also have different regularization of different regions. A moderate filtering or denoising step is taken in these studies to ease the block artifacts. Applicants' use of overlapping blocks has some similarities to these strategies. In Applicants' study, all images were scaled to have a maximum value of 250 and no block artifacts were observed for a wide range of $\lambda$ (0~500) with our experimental settings. Most of the datasets tested showed optimal behavior at $\lambda=50$. Thus a $\lambda$ value of 50 was chosen to reconstruct all the datasets.

BLOSM is a motion-adaptive regional-sparsity-based CS method. Other methods such as k-t FOCUSS (4) and, recently, MASTeR (17) also incorporate motion compensation into a CS reconstruction. In k-t FOCUSS with motion estimation and compensation, although motions are estimated on a regional basis, x-f sparsity is exploited. In MASTeR, motion estimation varies regionally and temporal-difference sparsity is used. In contrast, BLOSM uses regional motion estimation and exploits regional matrix low-rank structure. Also, these three methods differ in the details of the motion estimation algorithms, which likely effects resulting image quality. Previously, most CS methods for dynamic imaging have exploited sparsity using either whole images (such as k-t SLR) or single pixels (such as temporal difference or x-f sparsity). BLOSM, which exploits regional sparsity, is in between these two extremes, and provides the advantages of greater flexibility (compared to whole images) and use of more information (compared to single pixels). The k-t SLR method used in this study for comparison was modified to use the IST optimization algorithm and excluded the spatiotemporal total variance reported by Lingala et al (6). The modified k-t SLR method was used in order to make a fair comparison with BLOSM. Like k-t SLR, BLOSM could be extended to include extra sparsity constraints and could be solved by alternating direction algorithms (44). In the present implementations described herein. Applicants focused their efforts on evaluating BLOSM and other CS methods using only single-coil data. Alternatively, BLOSM may be combined with parallel imaging such as SENSE (19) and Self-consistent Parallel Imaging (SPIRiT) (45) by exploiting joint sparsity (3,46-48) to achieve higher acceleration rates and better reconstruction quality. BLOSM is also compatible with non-Cartesian k-space trajectories.

The present implementations focused on using BLOSM to reconstruct high-quality accelerated contrast-enhanced first-pass cardiac perfusion images, even in the presence of respiration due to imperfect breathholding. Using the concepts of regional motion tracking and regional sparsity, BLOSM may also be applicable to other dynamic MRI such as cardiac cine imaging, T1 mapping, multi-TI arterial spin labeling, and other methods. Acceleration of these applications with BLOSM may be the subject of future studies. The time consumed by the motion estimation (65% of total time) and block handling (21% of total time) may be decreased through better parallelization of the code and implementation using a graphics processing unit. In summary, BLOSM makes use of data-driven spatiotemporal basis functions applied to regions and achieves motion compensation by embedding regional motion tracking into the iterative CS image reconstruction algorithm. With this combination, BLOSM attains the benefits of data-driven spatiotemporal basis functions while reducing artifacts from non-periodic motion such as breathing.

The specific configurations, choice of materials and the size and shape of various elements can be varied according to particular design specifications or constraints requiring a system or method constructed according to the principles of the present disclosure. Such changes are intended to be embraced within the scope of the present disclosure. The presently disclosed embodiments, therefore, are considered in all respects to be illustrative and not restrictive. The scope of the present disclosure is indicated by the appended claims, rather than the foregoing description, and all changes that come within the meaning and range of equivalents thereof are intended to be embraced therein.

LIST OF REFERENCES

1. Lustig M, Donoho D, Pauly J M. Sparse MRI: The application of compressed sensing for rapid MR imaging. Magnetic Resonance in Medicine 2007; 58(6):1182-1195.
2. Gamper U, Boesiger P, Kozerke S. Compressed sensing in dynamic MRI. Magnetic resonance in medicine 2008; 59(2):365-373.
3. Otazo R, Kim D, Axel L, Sodickson D K. Combination of compressed sensing and parallel imaging for highly accelerated first-pass cardiac perfusion MRI. Magnetic Resonance in Medicine 2010; 64(3):767-776.
4. Jung H, Sung K, Nayak K S, Kim E Y, Ye J C. k-t FOCUSS: A General Compressed Sensing Framework for High Resolution Dynamic MRI. Magnetic Resonance in Medicine 2009; 61(1):103-116.
5. Adluru G, Awate S P, Tasdizen T, Whitaker R T, Dibella E V. Temporally constrained reconstruction of dynamic cardiac perfusion MRI. Magnetic Resonance in Medicine 2007; 57(6):1027-1036.
6. Lingala S G, Hu Y, DiBella E, Jacob M. Accelerated Dynamic MRI Exploiting Sparsity and Low-Rank Structure: k-t SLR. Ieee T Med Imaging 2011; 30(5):1042-1054.
7. Usman M, Atkinson D, Odille F, Kolbitsch C, Vaillant G, Schaeffter T, Batchelor P G, Prieto C. Motion corrected compressed sensing for free-breathing dynamic cardiac MRI. Magn Reson Med 2012.
8. Lingala S, DiBella E, Chefd'hotel C, Nadar M, Jacob M. Motion compensated reconstruction for myocardial perfusion MRI. J Cardiovasc Magn R 2012; 14(Suppl 1):M11.
9. Adluru G, DiBella E. A comparison of L1 and L2 norms as temporal constraints for reconstruction of undersampled dynamic contrast enhanced cardiac scans with respiratory motion. Proceedings of ISMRM 2008:340.
10. Lingala S G, Nadar M, Chefd'hotel C, Z. L. Unified reconstruction and motion estimation in cardiac perfusion MRI. 2011: 65-68.
11. Simpson I A, Chung K J, Glass R F, Sahn D J, Sherman F S, Hesselink J. Cine magnetic resonance imaging for evaluation of anatomy and flow relations in infants and children with coarctation of the aorta. Circulation 1988; 78(1):142-148.
12. Lustig M, J. M. S, Donoho D, Pauly J M. k-t SPARSE: high frame rate dynamic MRI exploiting spatio-temporal sparsity. Proceedings of ISMRM 2006:2420.
13. Aletras A H, Ding S, Balaban R S, Wen H. DENSE: displacement encoding with stimulated echoes in cardiac functional MRI. J Magn Reson 1999; 137(1):247-252.
14. Zhao B, Haldar J P, Liang Z P. PSF model-based reconstruction with sparsity constraint: algorithm and application to real-time cardiac MRI. Conf Proc IEEE Eng Med Biol Soc 2010; 2010:3390-3393.
15. Hansen M S, Sorensen T S, Arai A E, Kellman P. Retrospective reconstruction of high temporal resolution cine images from real-time MRI using iterative motion correction. Magn Reson Med 2012; 68(3):741-750.
16. Batchelor P G, Atkinson D, Irarrazaval P, Hill D L G, Hajnal J, Larkman D. Matrix description of general motion correction applied to multishot images. Magnetic Resonance in Medicine 2005; 54(5):1273-1280.
17. Asif M S, Hamilton L, Brummer M, Romberg J. Motion-adaptive spatio-temporal regularization for accelerated dynamic MRI. Magn Reson Med 2012.
18. Chen X, Salerno M, Antkowiak P F, Epstein F H. Motion-Guided Temporally-Constrained Compressed Sensing for Dynamic MRI. Proceedings of ISMRM 2012:1230.
19. Chen X, Salerno M, Meyer C H, Epstein F H. Block LOw-Rank Sparsity with Motion guidance (BLOSM) for Accelerated Dynamic MRI. Proceedings of ISMRM 2013: 4555.
20. Bergen J R, Anandan P, Hanna K J, Hingorani R. Hierarchical Model-Based Motion Estimation. Lecture Notes in Computer Science 1992; 588:237-252.
21. Makela T, Clarysse P, Sipila O, Pauna N, Pham Q C, Katila T, Magnin I E. A review of cardiac image registration methods. Ieee T Med Imaging 2002; 21(9):1011-1021.
22. Gotte M J, van Rossum A C, Twisk J W R, Kuijer J P A, Marcus J T, Visser C A. Quantification of regional contractile function after infarction: strain analysis superior to wall thickening analysis in discriminating infarct from remote myocardium. J Am Coll Cardiol 2001; 37(3):808-817.
23. Setser R M, White R D, Sturm B, McCarthy P M, Starling R C, Young J B, Kasper J, Buda T, Obuchowski N, Lieber M L. Noninvasive assessment of cardiac mechanics and clinical outcome after partial left ventriculectomy. Ann Thorac Surg 2003; 76(5):1576-1585; discussion 1585-1576.
24. Buehrer M, Pruessmann K P, Boesiger P, Kozerke S. Array compression for MRI with large coil arrays. Magnetic resonance in medicine: official journal of the Society of Magnetic Resonance in Medicine/Society of Magnetic Resonance in Medicine 2007; 57(6):1131-1139.

25. Avants B B, Tustison N J, Song G, Cook P A, Klein A, Gee J C. A reproducible evaluation of ANTs similarity metric performance in brain image registration. Neuroimage 2011; 54(3):2033-2044.
26. Nicholas J. Tustison B B A. Diffeomorphic Directly Manipulated Free-Form Deformation Image Registration via Vector Fields Flows. Proceedings of the Fifth Workshop on Biomedical Image Registration 2012; 7359:31-39.
27. Thevenaz P, Blu T, Unser M. Interpolation revisited. Ieee T Med Imaging 2000; 19(7):739-758.
28. Zhao B, Haldar J P, Brinegar C, Liang Z P. Low rank matrix recovery for real-time cardiac MRI. 2010: 996-999.
29. Liang Z P. Spatiotemporal imaging with partially separable functions. 2007: 988-991.
30. Xue H, Shah S, Greiser A, Guetter C, Littmann A, Jolly M P, Arai A E, Zuehlsdorff S, Guehring J, Kellman P. Motion correction for myocardial T1 mapping using image registration with synthetic image estimation. Magnetic resonance in medicine: official journal of the Society of Magnetic Resonance in Medicine/Society of Magnetic Resonance in Medicine 2012; 67(6):1644-1655.
31. Akcakaya M, Basha T A, Goddu B, Goepfert L A, Kissinger K V, Tarokh V, Manning W J, Nezafat R. Low-dimensional-structure self-learning and thresholding: regularization beyond compressed sensing for MRI reconstruction. Magnetic Resonance in Medicine 2011; 66(3):756-767.
32. Akcakaya M, Basha T A, Chan R H, Rayatzadeh H, Kissinger K V, Goddu B, Goepfert L A, Manning W J, Nezafat R. Accelerated contrast-enhanced whole-heart coronary MRI using low-dimensional-structure self-learning and thresholding. Magnetic Resonance in Medicine 2012; 67(5):1434-1443.
33. Vitanis V, Manka R, Giese D, Pedersen H, Plein S, Boesiger P, Kozerke S. High Resolution Three-Dimensional Cardiac Perfusion Imaging Using Compartment-Based k-t Principal Component Analysis. Magnetic Resonance in Medicine 2011; 65(2):575-587.
34. Dillencourt M B, Samet H, Tamminen M. A General-Approach to Connected-Component Labeling for Arbitrary Image Representations. J Acm 1992; 39(2):253-280.
35. Majumdar A, Ward R K. An algorithm for sparse MRI reconstruction by Schatten p-norm minimization. Magnetic resonance imaging 2011; 29(3):408-417.
36. Combettes P L, Wajs V R. Signal recovery by proximal forward-backward splitting. Multiscale Model Sim 2005; 4(4):1168-1200.
37. Dabov K, Foi A, Katkovnik V, Egiazarian K. Image denoising by sparse 3-D transform-domain collaborative filtering. IEEE Trans Image Process 2007; 16(8):2080-2095.
38. Jung H. k-t FOCUSS.
39. Petzschner F H, Ponce I P, Blaimer M, Jakob P M, Breuer F A. Fast MR Parameter Mapping Using k-t Principal Component Analysis. Magnetic Resonance in Medicine 2011; 66(3):706-716.
40. Larson A C, White R D, Laub G, McVeigh E R, Li D, Simonetti O P. Self-gated cardiac cine MRI. Magnetic resonance in medicine: official journal of the Society of Magnetic Resonance in Medicine/Society of Magnetic Resonance in Medicine 2004; 51(1):93-102.
41. Brinegar C, Zhang H, Wu Y J, Foley L M, Hitchens T, Ye Q, Ho C, Liang Z P. First-pass perfusion cardiac MRI using the Partially Separable Functions model with generalized support. Conf Proc IEEE Eng Med Biol Soc 2010; 2010: 2833-2836.
42. Feng X, Salerno M, Kramer C M, Meyer C H. Kalman filter techniques for accelerated Cartesian dynamic cardiac imaging. Magn Reson Med 2012.
43. Kim D, Gilson W D, Kramer C M, Epstein F H. Myocardial tissue tracking with two-dimensional cine displacement-encoded MR imaging: development and initial evaluation. Radiology 2004; 230(3):862-871.
44. Yang J F, Zhang Y. Alternating Direction Algorithms for L(1)-Problems in Compressive Sensing. Siam J Sci Comput 2011; 33(1):250-278.
45. Meyer C H, Hu B S, Nishimura D G, Macovski A. Fast spiral coronary artery imaging. Magnetic resonance in medicine: official journal of the Society of Magnetic Resonance in Medicine/Society of Magnetic Resonance in Medicine 1992; 28(2):202-213.
46. Liang D, Liu B, Wang J J, Ying L. Accelerating SENSE Using Compressed Sensing. Magnetic Resonance in Medicine 2009; 62(6):1574-1584.
47. Kim D, Dyvorne H A, Otazo R, Feng L, Sodickson D K, Lee V S. Accelerated Phase-Contrast Cine MRI Using k-t SPARSE-SENSE. Magnetic Resonance in Medicine 2012; 67(4):1054-1064.
48. Rasche V, Proksa R, Sinkus R, Bornert P, Eggers H. Resampling of data between arbitrary grids using convolution interpolation. Ieee T Med Imaging 1999; 18(5):385-392.

What is claimed is:

1. A method for motion-compensation and regional sparsity in accelerated magnetic resonance imaging (MRI), comprising:
   (a) acquiring undersampled MRI data corresponding to a set of consecutive dynamic images associated with an area of interest of a subject;
   (b) defining the set of consecutive dynamic images as an initial set of estimated images;
   (c) separating an image of the initial set of estimated images into a plurality of image regions;
   (d) performing motion tracking for each image region of the plurality of image regions, throughout the initial set of estimated images, based at least in part on motion data associated with motion of the subject;
   (e) grouping the motion-tracked image regions into a plurality of clusters, based at least in part on spatial contents;
   (f) applying a sparsity transform to the plurality of clusters to form a plurality of sparsity-exploited, transformed image regions;
   (g) forming a set of merged images from the plurality of sparsity-exploited, transformed image regions; and
   (h) updating the set of merged images based on data fidelity, to form an updated set of estimated images.

2. The method of claim 1, further comprising:
   defining the updated set of estimated images as the initial set of estimated images; and
   iteratively performing steps (c)-(h) until a predetermined condition is satisfied.

3. The method of claim 2, wherein the predetermined condition corresponds to at least one of a predetermined number of iterations, a predetermined period of time, and a predetermined convergence level.

4. The method of claim 1, wherein the motion data comprises motion trajectory data for each image region of the plurality of image regions, extracted from the acquired undersampled MRI data.

5. The method of claim 1, wherein applying the sparsity transform to the plurality of clusters comprises applying singular value decomposition (SVD) to the plurality of clusters.

6. The method of claim 1, wherein the motion data associated with motion of the subject corresponds to at least one of a respiratory activity and cardiac activity of the subject.

7. The method of claim 1, wherein each image region of the plurality of image regions corresponds to a unique block of pixels.

8. The method of claim 1, wherein grouping the motion-tracked image regions into a plurality of clusters based at least in part on spatial contents comprises grouping the motion tracked image regions according to at least one of structurally-similar and temporally-related contents.

9. A system, comprising:
a magnetic resonance imaging (MRI) device;
one or more processors;
at least one memory device coupled to the one or more processors and storing computer-readable instructions that, when executed by the one or more processors, cause the system to:
 (a) acquire undersampled MRI data corresponding to a set of consecutive dynamic images associated with an area of interest of a subject;
 (b) define the set of consecutive dynamic images as an initial set of estimated images;
 (c) separate an image of the initial set of estimated images into a plurality of image regions;
 (d) perform motion tracking for each image region of the plurality of image regions, throughout the initial set of estimated images, based at least in part on motion data associated with motion of the subject;
 (e) group the motion-tracked image regions into a plurality of clusters, based at least in part on spatial contents;
 (f) apply a sparsity transform to the plurality of clusters to form a plurality of sparsity-exploited, transformed image regions;
 (g) form a set of merged images from the plurality of sparsity-exploited, transformed image regions; and
 (h) update the set of merged images based on data fidelity, to form an updated set of estimated images.

10. The system of claim 9, wherein the computer-readable instructions, when executed by the one or more processors, further cause the system to:
define the updated set of estimated images as the initial set of estimated images; and
iteratively perform steps (c)-(h) until a predetermined condition is satisfied.

11. The system of claim 10, wherein the predetermined condition corresponds to at least one of a predetermined number of iterations, a predetermined period of time, and a predetermined convergence level.

12. The system of claim 9, wherein the motion data comprises motion trajectory data for each image region of the plurality of image regions, extracted from the acquired undersampled MRI data.

13. The system of claim 9, wherein applying the sparsity transform to the plurality of clusters comprises applying singular value decomposition (SVD) to the plurality of clusters.

14. The system of claim 9, wherein the motion data associated with motion of the subject corresponds to at least one of a respiratory activity and cardiac activity of the subject.

15. The system of claim 9, wherein each image region of the plurality of image regions corresponds to a unique block of pixels.

16. The system of claim 9, wherein grouping the motion-tracked image regions into a plurality of clusters based at least in part on spatial contents comprises grouping the motion tracked image regions according to at least one of structurally-similar and temporally-related contents.

17. A non-transitory computer-readable medium storing instructions that, when executed by one or more processors, cause a computer to:
 (a) acquire undersampled magnetic resonance imaging data corresponding to a set of consecutive dynamic images associated with an area of interest of a subject;
 (b) define the set of consecutive dynamic images as an initial set of estimated images;
 (c) separate an image of the initial set of estimated images into a plurality of image regions;
 (d) perform motion tracking for each image region of the plurality of image regions, throughout the initial set of estimated images, based at least in part on motion data associated with motion of the subject;
 (e) group the motion-tracked image regions into a plurality of clusters, based at least in part on spatial contents;
 (f) apply a sparsity transform to the plurality of clusters to form a plurality of sparsity-exploited, transformed image regions;
 (g) form a set of merged images from the plurality of sparsity-exploited, transformed image regions; and
 (h) update the set of merged images based on data fidelity, to form an updated set of estimated images.

18. The non-transitory computer-readable medium of claim 17, wherein the stored computer-readable instructions, when executed by the one or more processors, further cause the computer to:
define the updated set of estimated images as the initial set of estimated images; and
iteratively perform steps (c)-(h) until a predetermined condition is satisfied.

19. The non-transitory computer-readable medium of claim 18, wherein the predetermined condition corresponds to at least one of a predetermined number of iterations, a predetermined period of time, and a predetermined convergence level.

20. The non-transitory computer-readable medium of claim 17, wherein the motion data comprises motion trajectory data for each image region of the plurality of image regions, extracted from the acquired undersampled MRI data.

21. The non-transitory computer-readable medium of claim 17, wherein applying the sparsity transform to the plurality of clusters comprises applying singular value decomposition (SVD) to the plurality of clusters.

22. The non-transitory computer-readable medium of claim 17, wherein the motion data associated with motion of the subject corresponds to at least one of a respiratory activity and cardiac activity of the subject.

23. The non-transitory computer-readable medium of claim 17, wherein each image region of the plurality of image regions corresponds to a unique block of pixels.

24. The non-transitory computer-readable medium of claim 17, wherein grouping the motion-tracked image regions into a plurality of clusters based at least in part on spatial contents comprises grouping the motion tracked image regions according to at least one of structurally-similar and temporally-related contents.

* * * * *